United States Patent
Sato

(10) Patent No.: US 12,021,497 B2
(45) Date of Patent: Jun. 25, 2024

(54) BALUN

(71) Applicant: Murata Manufacturing Co., Ltd., Nagaokakyo (JP)

(72) Inventor: Takuya Sato, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 330 days.

(21) Appl. No.: 17/675,448

(22) Filed: Feb. 18, 2022

(65) Prior Publication Data

US 2022/0173712 A1 Jun. 2, 2022

Related U.S. Application Data

(63) Continuation of application No. PCT/JP2020/026385, filed on Jul. 6, 2020.

(30) Foreign Application Priority Data

Sep. 17, 2019 (JP) ................................ 2019-168313
Feb. 28, 2020 (JP) ................................ 2020-033545

(51) Int. Cl.
  *H03H 7/42* (2006.01)
  *H01F 27/28* (2006.01)
  *H01P 5/10* (2006.01)
  *H03H 7/01* (2006.01)
  *H03H 7/09* (2006.01)
  *H03H 1/00* (2006.01)

(52) U.S. Cl.
  CPC ........... *H03H 7/42* (2013.01); *H01F 27/2804* (2013.01); *H01P 5/10* (2013.01); *H03H 7/0115* (2013.01); *H03H 7/09* (2013.01); *H01F 2027/2809* (2013.01); *H03H 2001/0085* (2013.01)

(58) Field of Classification Search
  CPC .............................. H01P 5/10; H03H 7/0115; H03H 2001/0085; H03H 7/09; H03H 7/42
  USPC .................................... 333/25, 175, 177, 185
  See application file for complete search history.

(56) References Cited

U.S. PATENT DOCUMENTS 6,018,277 A * 1/2000 Vaisanen .................... H01P 5/10
                                                        333/204
2017/0170800 A1   6/2017 Saito

FOREIGN PATENT DOCUMENTS

| JP | 03-19358 A | 1/1991 |
| JP | 2005-244637 A | 9/2005 |
| JP | 2006-014127 A | 1/2006 |

(Continued)

OTHER PUBLICATIONS

Official Communication issued in International Patent Application No. PCT/JP2020/026385, mailed on Sep. 24, 2020.

*Primary Examiner* — Rakesh B Patel
(74) *Attorney, Agent, or Firm* — Keating & Bennett, LLP

(57) ABSTRACT

A balun includes an unbalanced terminal, balanced terminals, and lines, and converts a signal between an unbalanced line and an balanced line. A first line is connected between the unbalanced terminal and a reference potential. A second line is connected between the balanced terminal and the reference potential, and is coupled to the first line. A third line is connected between the balanced terminal and the reference potential, and is coupled to the first line. A fourth line is connected in parallel to the second line, and is coupled to the third line. The fourth line is configured such that a signal with an opposite phase to that of a signal passing through the third line passes through the fourth line.

20 Claims, 15 Drawing Sheets

(56) References Cited

FOREIGN PATENT DOCUMENTS

| JP | 2014-216358 A | 11/2014 |
|---|---|---|
| JP | 2016-086327 A | 5/2016 |

\* cited by examiner

BALUN

CROSS REFERENCE TO RELATED APPLICATIONS

This application claims the benefit of priority to Japanese Patent Application No. 2019-168313 filed on Sep. 17, 2019 and Japanese Patent Application No. 2020-033545 filed on Feb. 28, 2020, and is a Continuation Application of PCT Application No. PCT/JP2020/026385 filed on Jul. 6, 2020. The entire contents of each application are hereby incorporated herein by reference.

BACKGROUND OF THE INVENTION

1. Field of the Invention

The present disclosure relates to a balun that converts a signal between an unbalanced line and a balanced line, and more particularly relates to a structure for improving characteristics in a laminated balun.

2. Description of the Related Art

A balun is a converter to be used for mutual conversion between an unbalanced signal and a balanced signal. A balanced signal is a pair of signals having equal amplitudes and mutually opposite phases, and is generally used in a differential amplifier circuit or the like in an IC in a communication system. On the other hand, an unbalanced signal is a signal to be used in a transmission system for transmitting a change in potential with respect to a ground potential, and an input/output signal of a microstrip line or an antenna corresponds to the unbalanced signal.

In mobile wireless communication devices such as smartphones, mobile phones, and the like, a balun is used in a front-end circuit for connecting an unbalanced line of an antenna and a balanced line of an IC circuit that processes a radio frequency signal. In these communication devices, there is a high demand for reduction in size and thickness, and accompanied by this trend, there is a demand for further reduction in size of individual devices forming a device such as a balun. Further, a frequency band of a radio frequency signal to be used for communication is being widened, and there is a growing need for each device to increase a band width.

As a typical balun, a Marchand balun in which a line having a length ($\lambda/2$) that is ½ of a wavelength $\lambda$ and connected to an unbalanced line is coupled with two lines having a length of $\lambda/4$ and connected to a balanced line, or a two-wire balun in which a line having a length of $\lambda/2$ and connected between an unbalanced line and one balanced line is coupled with a line having a length of $\lambda/2$ and connected to the other balanced line is known. In these baluns, it is necessary to form lines to be coupled with each other in the same substrate, so that the substrate area becomes large, which is not suitable for miniaturization of the entire device.

In addition, a matched filter balun formed by coupling an inductor included in a low pass filter connected to an unbalanced line and an inductor included in a high pass filter connected to each of two balanced lines is suitable for miniaturization, but has a problem that a usable frequency band width is relatively narrow.

In order to solve such a problem, a three-wire balun using three lines has been proposed in which a line having a length of $\lambda/4$ and connected to an unbalanced line and lines having a length of $\lambda/4$ and connected to two balanced lines are coupled. However, although this type of balun is suitable for miniaturization and a wider band width, there is room for improvement in the balance characteristics of two balanced signals.

SUMMARY OF THE INVENTION

Preferred embodiments of the present invention each improve balance characteristics while achieving miniaturization and a wider band width in a balun to be used in a communication device.

A balun according to a preferred embodiment of the present invention includes an unbalanced terminal, a first balanced terminal and a second balanced terminal, and a first line to a fourth line. The first line is connected between the unbalanced terminal and a reference potential. The second line is connected between the first balanced terminal and the reference potential, and is coupled to the first line. The third line is connected between the second balanced terminal and the reference potential, and is coupled to the first line. The fourth line is connected in parallel to the second line, and is coupled to the third line. The fourth line is arranged such that a signal with an opposite phase to a phase of a signal passing through the third line passes through the fourth line.

A balun according to a preferred embodiment of the present invention includes an unbalanced terminal, a first balanced terminal and a second balanced terminal, a first line to a third line, and a fifth line. The first line is connected between the unbalanced terminal and a reference potential. The second line is connected between the first balanced terminal and the reference potential, and is coupled to the first line. The third line is connected between the second balanced terminal and the reference potential, and is coupled to the first line. The fifth line is connected in parallel to the third line, and is coupled to the second line. The fifth line is arranged such that a signal with an opposite phase to a phase of a signal passing through the second line passes through the fifth line.

A balun according to a preferred embodiment of the present invention includes a dielectric substrate, an unbalanced terminal, a first balanced terminal and a second balanced terminal, and a first line to a fourth line. The dielectric substrate includes a plurality of dielectric layers that are laminated. The unbalanced terminal, the first balanced terminal, and the second balanced terminal are provided in the dielectric substrate. The first line is connected between the unbalanced terminal and a reference potential. The second line is connected between the first balanced terminal and the reference potential. The third line is connected between the second balanced terminal and the reference potential. The fourth line is connected in parallel to the second line. Each of the first line to the fourth line defines a coil with a winding axis in a lamination direction of the dielectric substrate. In the dielectric substrate, the first line to the fourth line are laminated in an order of the second line, the first line, the third line, and the fourth line in the lamination direction. A winding direction of the second line from the first balanced terminal toward the reference potential is the same direction as a winding direction of the first line from the unbalanced terminal toward the reference potential. A winding direction of the third line from the second balanced terminal toward the reference potential is opposite to the winding direction of the first line from the unbalanced terminal toward the reference potential. A winding direction of the fourth line from the first balanced terminal toward the reference potential is opposite to the winding direction of the third line from the second balanced terminal toward the reference potential. Openings of the coils defined by the first line to the fourth line overlap each other in plan view from the lamination direction of the dielectric substrate.

A balun according to a preferred embodiment of the present invention includes a dielectric substrate, an unbalanced terminal, a first balanced terminal and a second balanced terminal, a first line to a third line, and a fifth line. The dielectric substrate includes a plurality of dielectric layers that are laminated. The unbalanced terminal, the first balanced terminal, and the second balanced terminal are provided in the dielectric substrate. The first line is connected between the unbalanced terminal and a reference potential. The second line is connected between the first balanced terminal and the reference potential. The third line is connected between the second balanced terminal and the reference potential. The fifth line is connected in parallel to the third line. Each of the first line, the second line, the third line, and the fifth line defines a coil with a winding axis in a lamination direction of the dielectric substrate. In the dielectric substrate, the first line to the third line, and the fifth line are laminated in an order of the fifth line, the second line, the first line, and the third line in the lamination direction. A winding direction of the second line from the first balanced terminal toward the reference potential is the same direction as a winding direction of the first line from the unbalanced terminal toward the reference potential. A winding direction of the third line from the second balanced terminal toward the reference potential is opposite to the winding direction of the first line from the unbalanced terminal toward the reference potential. A winding direction of the fifth line from the second balanced terminal toward the reference potential is opposite to the winding direction of the second line from the first balanced terminal toward the reference potential. Openings of the coils defined by the first line, the second line, the third line, and the fifth line overlap each other in plan view from the lamination direction of the dielectric substrate.

According to each of preferred embodiments of the present invention, a configuration is provided in which at least one of two balanced lines (e.g., a second line and a third line) coupled to the first line connected to the unbalanced terminal is further coupled with a signal of the other balanced line. With such a configuration, it is possible to improve balance characteristics while achieving miniaturization and a wider band width.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Figure 1:
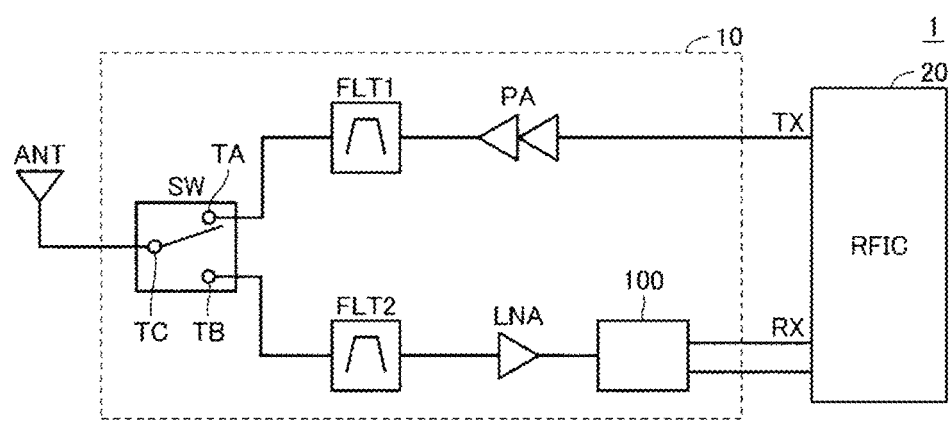
FIG. 1 is a block diagram of a communication device including a front-end circuit in which a balun according to Preferred Embodiment 1 of the present invention is provided.

Hereinafter, preferred embodiments of the present disclosure will be described in detail with reference to the drawings. In the drawings, the same or corresponding portions are denoted by the same reference signs, and description thereof will not be repeated.

Preferred Embodiment 1

Overview of Communication Device

FIG. 1 is a block diagram of a communication device 1 including a front-end circuit 10 in which a balun 100 according to Preferred Embodiment 1 is provided. With reference to FIG. 1, the communication device 1 includes an antenna ANT and an RFIC 20 defining and functioning as a signal processing circuit in addition to the front-end circuit 10.

The RFIC 20 outputs a radio frequency signal to a transmission-side line TX, and radiates a radio wave from the antenna ANT via the front-end circuit 10. Further, the RFIC 20 receives a radio wave received by the antenna ANT from a reception-side line RX, processes the received signal, and transmits the processed signal to a circuit at a subsequent stage.

The front-end circuit 10 includes a switch SW, filters FLT1 and FLT2, a power amplifier PA, and a low-noise amplifier LNA in addition to the balun 100. The switch SW is used to switch between transmission and reception of radio waves in the antenna ANT. The switch SW includes a common terminal TC and two selection terminals TA and TB. The common terminal TC is connected to the antenna ANT. The selection terminal TA is connected to the transmission-side line TX with the filter FLT1 and the power amplifier PA interposed therebetween. The selection terminal TB is connected to the reception-side line RX with the filter FLT2, the low-noise amplifier LNA, and the balun 100 interposed therebetween.

When a radio wave is radiated from the antenna ANT, the common terminal TC of the switch SW is connected to the selection terminal TA. On the other hand, when a radio wave is received by the antenna ANT, the common terminal TC of the switch SW is connected to the selection terminal TB.

The power amplifier PA amplifies a radio frequency signal transmitted from the RFIC 20, and outputs the amplified signal to the filter FLT1. The filter FLT1 includes a low pass filter, a high pass filter, or a band pass filter, and passes a signal in a desired frequency band in the radio frequency signal amplified by the power amplifier PA. The radio frequency signal that has passed through the filter FLT1 is radiated from the antenna ANT via the switch SW.

The filter FLT2 is a low pass filter, a high pass filter, or a band pass filter, similar to the filter FLT1 described above, and passes a signal in a desired frequency band of a radio frequency signal received by the antenna ANT. The radio frequency signal having passed through the filter FLT2 is amplified with low noise by the low-noise amplifier LNA to be transmitted to the balun 100.

The balun 100 is a converter to convert an unbalanced signal into a balanced signal. The balanced signal is a pair of signals having equal or substantially equal amplitudes and mutually opposite phases, and the unbalanced signal is a signal to be used in a transmission system to transmit a change in potential with respect to a ground potential. In general, a line to be connected to an antenna is provided from an unbalanced line. On the other hand, in an IC circuit such as the RFIC 20, processing is performed by using a balanced signal. As such, a reception signal from the antenna ANT that has been transmitted using an unbalanced signal is converted into a balanced signal suitable to process in the RFIC 20 by using the balun 100.

Configuration of Balun

Figure 2:
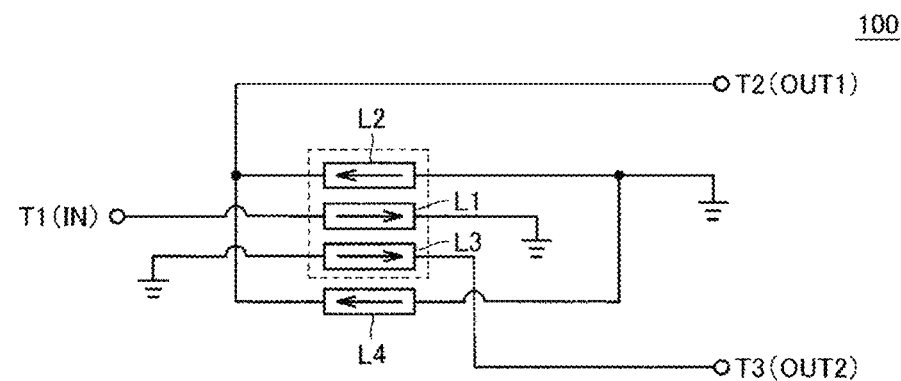
FIG. 2 is a first example of a circuit diagram of the balun illustrated in FIG. 1.

FIG. 2 is a first example of a circuit diagram of the balun 100 in FIG. 1. With reference to FIG. 2, the balun 100 includes an unbalanced terminal T1, two balanced terminals T2 and T3, and four lines (a first line L1 to a fourth line L4). When a wavelength of a radio frequency signal to be passed is defined as λ, each line has an electrical length of about λ/4.

In the following description, a case is exemplified in which the unbalanced terminal T1 is used as an input terminal IN, the balanced terminals T2 and T3 are used as output terminals OUT1 and OUT2, respectively, and an unbalanced signal is converted into a balanced signal, the balun 100 can also be used when a balanced signal input to the balanced terminal T2 and the balanced terminal T3 is converted into an unbalanced signal to be output from the unbalanced terminal T1.

With reference to FIG. 2, one end of the first line L1 is connected to the unbalanced terminal T1, and the other end is connected to a reference potential that is a ground potential. One end of the second line L2 is connected to the balanced terminal T2, and the other end is connected to the reference potential. The second line L2 is electromagnetically coupled to the first line L1. When a radio frequency signal is transmitted as an input signal to the unbalanced terminal T1 and passes through the first line L1, a signal corresponding to the input signal is induced in the second line L2 by electromagnetic field coupling. The induced signal is output from the balanced terminal T2. That is, the signal passes through the second line L2 in a direction from the ground potential toward the balanced terminal T2. At this time, the second line L2 is disposed so that a signal with an opposite phase to that of a signal passing through the first line L1 passes through the second line L2.

In the circuit diagrams of the balun illustrated in FIG. 2 and the subsequent figures, an arrow illustrated in each line indicates a phase of a signal passing through the line. That is, when the arrows of adjacent lines in each circuit diagram are in the same direction, this means that signals with the same phase pass through two lines. Conversely, when the arrows of adjacent lines in each circuit diagram are in opposite directions, this means that signals with mutually opposite phases pass through two lines.

One end of the third line L3 is connected to the balanced terminal T3, and the other end is connected to the reference potential. The third line L3 is also electromagnetically coupled to the first line L1. When a radio frequency signal is transmitted as an input signal to the unbalanced terminal T1 and passes through the first line L1, a signal corresponding to the input signal is induced in the third line L3 by electromagnetic field coupling. The induced signal is output from the balanced terminal T3. That is, a signal passes through the third line L3 in a direction from the ground potential toward the balanced terminal T3. At this time, the third line L3 is disposed so that a signal with the same phase as that of a signal passing through the first line L1 passes through the third line L3.

The fourth line L4 is a line electrically connected in parallel to the second line L2, one end of the fourth line T4 is connected to the balanced terminal T2, and the other end thereof is connected to the reference potential. The fourth line L4 is electromagnetically coupled to the third line L3. At this time, the fourth line L4 is disposed so that a signal with an opposite phase to that of a signal passing through the third line L3 passes through the fourth line L4.

Figure 3A:
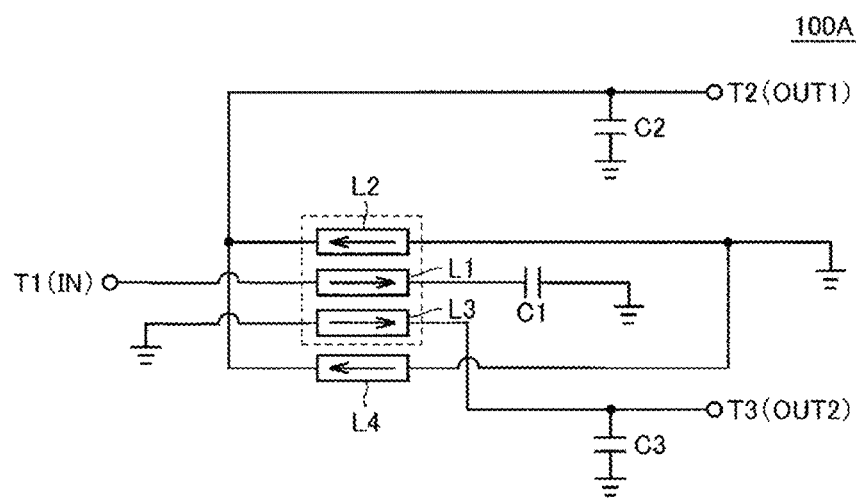
FIGS. 3A and 3B are a second example and a third example of the circuit diagram of the balun illustrated in FIG. 1.
Figure 3B:
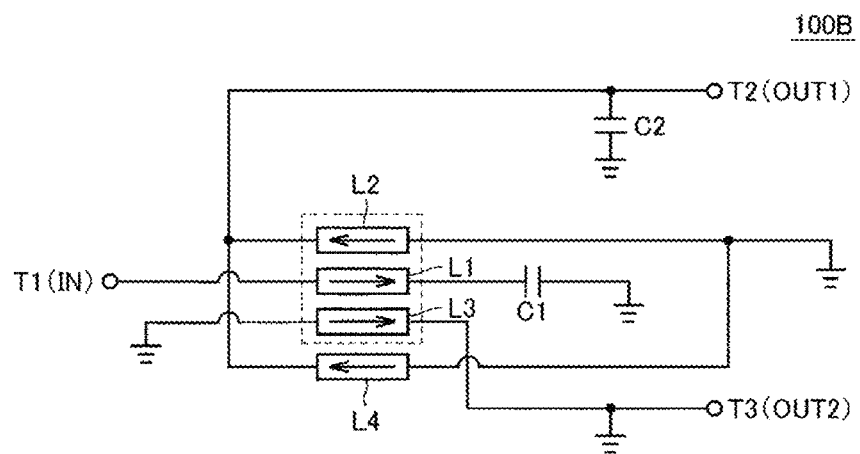

In the balun according to Preferred Embodiment 1, in order to achieve desired characteristics, adjustment capacitors may be appropriately provided as in baluns 100A and 100B illustrated in FIGS. 3A and 3B. For example, as in the balun 100A illustrated in FIG. 3A, a capacitor C1 may be disposed between the first line L1 and the reference potential to shorten a wavelength of a signal passing through the line. By shortening the wavelength, the length of each line can be shortened, which leads to miniaturization of the balun. Further, capacitors (capacitors C2 and C3) may be provided between the balanced terminal T2 and the reference potential and/or between the balanced terminal T3 and the reference potential to adjust the balance of balanced signals to be output from the balanced terminals T2 and T3. The capacitors C1 to C3 are not necessary components and are provided as necessary. For example, as in the balun 100B of FIG. 3B, only the capacitors C1 and C2 may be provided.

Next, the structure of the balun will be described in detail with reference to FIG. 4 to FIG. 6. Note that, in FIG. 4 to FIG. 6, an example of the balun 100B in which the adjustment capacitors C1 and C2 are disposed (FIG. 3B) will be described. Note that, in the case of the balun 100 illustrated in FIG. 2, the capacitors C1 and C2 in FIG. 4 to FIG. 6 are omitted.

Figure 4:
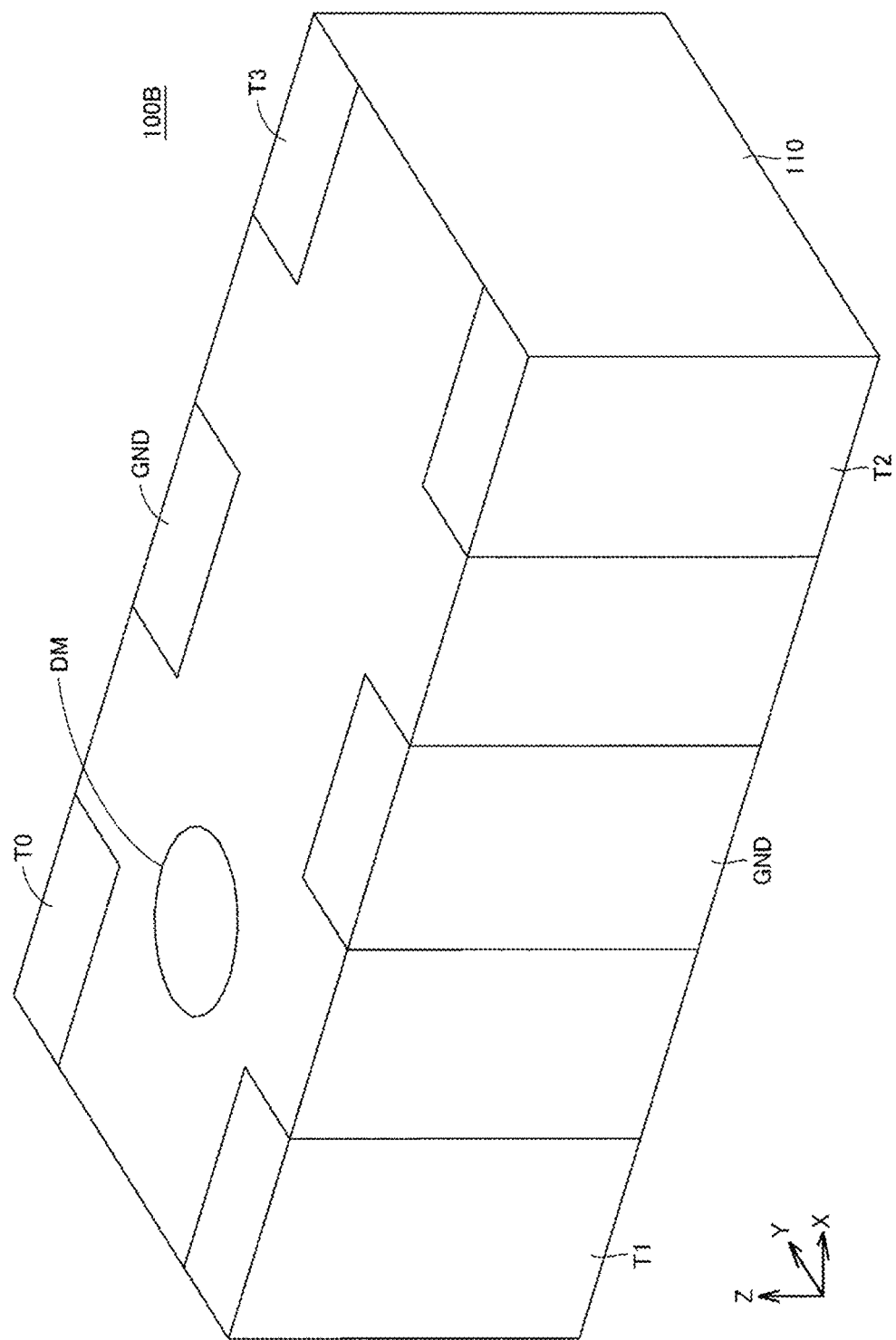
FIG. 4 is an external perspective view of the balun illustrated in FIG. 3B.
Figure 5:
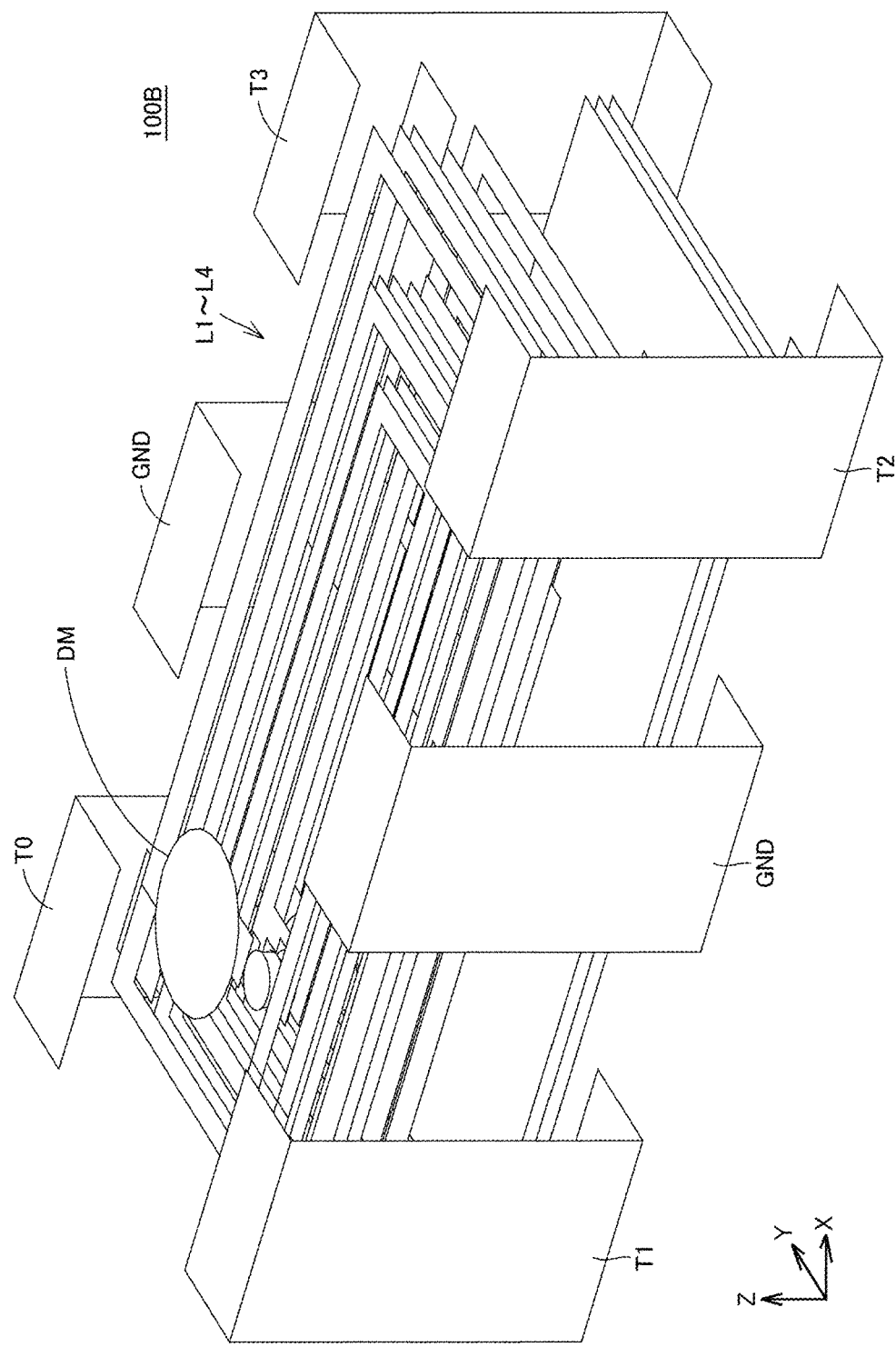
FIG. 5 is an internal structure diagram in which a dielectric is omitted from FIG. 4.

FIG. 4 is an external perspective view of the balun 100B, and FIG. 5 is a transparent view in which the dielectric in FIG. 4 is omitted. In addition, FIG. 6 is an exploded perspective view of the balun 100B. Note that, in FIG. 4 to FIG. 6, the lamination direction of dielectric layers is defined as a Z-axis, a direction along a long side of a dielectric substrate 110 is defined as an X-axis, and a direction along a short side thereof is defined as a Y-axis. In the following description, a surface of the dielectric substrate 110 in the positive direction of the Z-axis is also referred to as an upper surface, and a surface thereof in the negative direction of the Z-axis is also referred to as a lower surface. Additionally, in FIG. 6 and the exploded perspective views of FIG. 13, FIG. 15, and FIG. 16, which will be described later, external terminals provided at the side surfaces of the dielectrics are omitted for ease of explanation.

Figure 6:
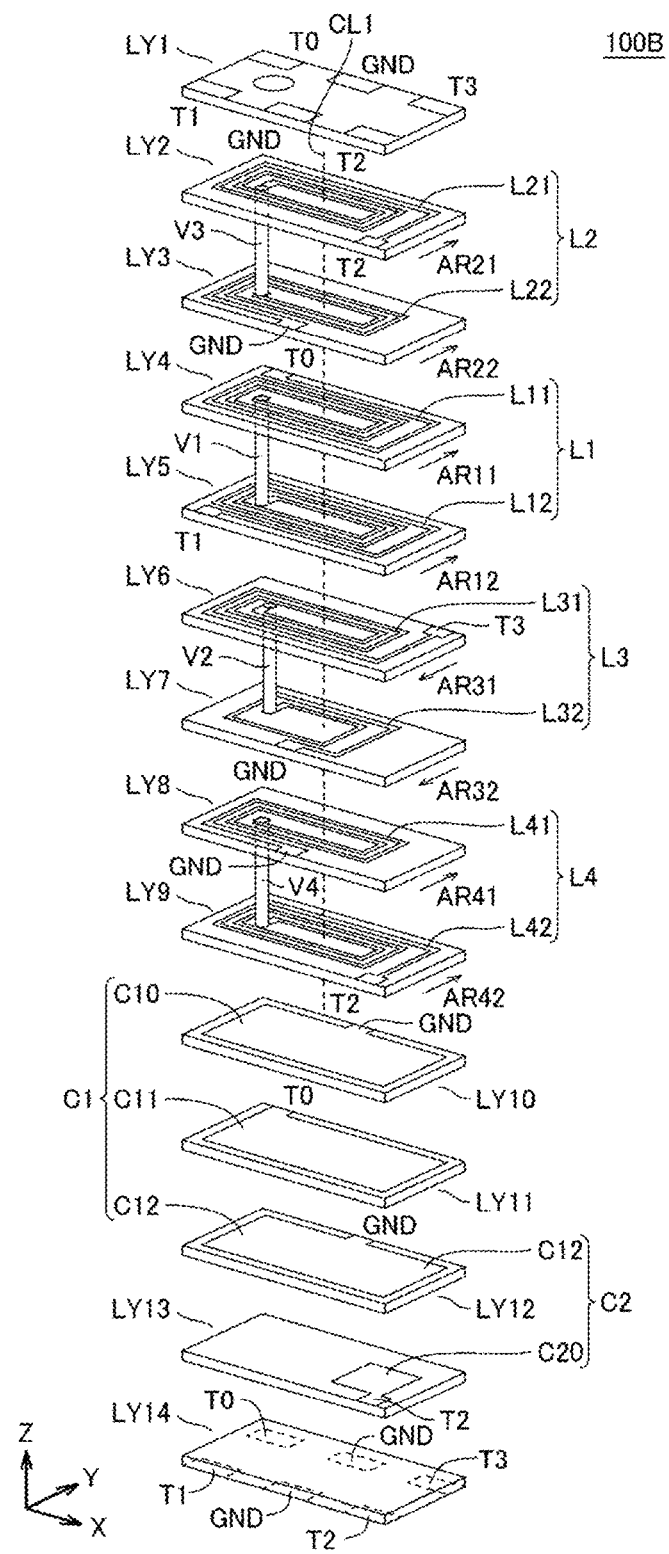
FIG. 6 is an exploded perspective view of the balun illustrated in FIG. 3B.

With reference to FIG. 4 to FIG. 6, the balun 100B includes the dielectric substrate 110 in which a plurality of dielectric layers LY1 to LY14 are laminated, and has a rectangular or substantially rectangular parallelepiped external shape. A plurality of outer electrodes having a C-shape or a substantially C-shape are provided on the outer surface of the dielectric substrate 110 so as to extend over the upper surface, the side surfaces, and the lower surface. The outer electrodes are used for connection with an external device, and are also used for connection between wiring patterns of respective layers of the dielectric substrate 110. The outer electrode includes a ground electrode GND (reference potential terminal) for connection to the unbalanced terminal T1, the balanced terminals T2 and T3, and the reference potential, and a terminal T0 for interlayer connection. A direction mark DM indicating a direction is denoted on the upper surface of the dielectric substrate 110. Note that, as in the present preferred embodiment, when the balun is used in a front-end circuit or the like, no signal may be connected to the terminal T0.

As illustrated in FIG. 5, each of the lines L1 to L4 is provided as a coil whose winding direction is the Z-axis direction. Additionally, in plan view of the dielectric substrate 110 from the lamination direction (the Z-axis direction), the openings of the coils in the lines L1 to L4 at least partially overlap each other. Note that the opening of the coil refers to an inner portion where the coil defined by each of the lines L1 to L4 annularly surrounds the winding axis in plan view of the dielectric substrate from the Z-axis direction. In the example illustrated in FIG. 6, the lines L1 to L4 are wound around a common winding axis CL1, and the openings of the coils defined by the lines L1 to L4 are overlapped across the lines L1 to L4.

In the dielectric substrate 110, the lines L1 to L4 are adjacently laminated in the order of the second line L2, the first line L1, the third line L3, and the fourth line L4 from the upper surface in the lamination direction. Due to such a lamination order, the first line L1 is coupled to the second line L2 and the third line L3, and the third line L3 is further coupled to the fourth line L4.

As illustrated in FIG. 6, each of the lines L1 to L4 is provided across two adjacent layers, and the coil in each layer is connected by a via. More specifically, the first line L1 has a configuration in which a coil L11 in the fourth layer LY4 and a coil L12 in the fifth layer LY5 are connected by a via V1. The second line L2 has a configuration in which a coil L21 in the second layer LY2 and a coil L22 in the third layer LY3 are connected by a via V2. The third line L3 has a configuration in which a coil L31 in the sixth layer LY6 and a coil L32 in the seventh layer LY7 are connected by a via V3. The fourth line L4 has a configuration in which a coil L41 in the eighth layer LY8 and a coil L42 in the ninth layer LY9 are connected by a via V4. Note that, depending on the specifications of the pass band, each coil may be provided in one layer or may be provided in three or more layers.

The tenth layer LY10 and the twelfth layer LY12 include flat plate electrodes C10 and C12 connected to the ground electrode GND, respectively. In addition, the eleventh layer LY11 includes a flat plate electrode C11 connected to the first line L1 by the terminal T0. The flat plate electrodes C10 to C12 define the capacitor C1 for adjustment.

The thirteenth layer LY13 includes the flat plate electrode C20, and the capacitor C2 for adjustment is provided together with the flat plate electrode C12 of the twelfth layer LY12.

The coils L11 and L12 of the first line L1 are wound in a counterclockwise (CCW) direction (arrows AR11 and AR12) from a connection point of the coil L12 with the unbalanced terminal T1 toward a connection point of the coil L11 with the terminal T0. An end portion of the coil L11 is connected to the flat plate electrode C11 of the eleventh layer LY11 with the terminal T0 provided at the side surface of the dielectric interposed therebetween, and is connected to the ground electrode GND with the capacitor C1 defined by the tenth layer LY10 to the twelfth layer LY12 interposed therebetween. Since a signal input to the unbalanced terminal T1 is transmitted from the unbalanced terminal T1 toward the ground electrode GND, the signal is transmitted in a CCW direction along the coils L11 and L12. Note that, in the following description, the winding direction (clockwise or counterclockwise direction) of each coil indicates a winding direction in plan view from the upper surface of the dielectric substrate 110 in the lamination direction (for example, a direction from the first layer LY1 toward the fourteenth layer LY14).

The coils L21 and L22 of the second line L2 are wound in the CCW direction (arrows AR21 and AR22) from a connection point of the coil L21 with the balanced terminal T2 toward a connection point of the coil L22 with the ground electrode GND. That is, the winding direction of the second line L2 from the balanced terminal T2 toward the reference potential is the same as the winding direction of the first line L1 from the unbalanced terminal T1 toward the reference potential. On the other hand, since a radio frequency signal induced by coupling with the first line L1 is output from the balanced terminal T2 of the second line L2, in the second line L2, the signal is transmitted in the clockwise (CW) direction along the coils L21 and L22.

The coils L31 and L32 of the third line L3 are wound in the CW direction (arrows AR31 and AR32) from a connection point of the coil L31 with the balanced terminal T3 toward a connection point of the coil L32 with the ground electrode GND. That is, the winding direction of the third line L3 from the balanced terminal T3 toward the reference potential is opposite to the winding direction of the first line L1 from the unbalanced terminal T1 toward the reference potential. On the other hand, since a radio frequency signal induced by coupling with the first line L1 is output from the balanced terminal T3 of the third line L3, in the third line L3, the signal is transmitted in the CCW direction along the coils L31 and L32.

The coils L41 and L42 of the fourth line L4 are wound in the CCW direction (arrows AR41 and AR42) from a connection point of the coil L42 with the balanced terminal T2 toward a connection point of the coil L41 with the ground electrode GND. That is, the winding direction of the fourth line L4 is opposite to the winding direction of the third line L3. Since the fourth line L4 is connected in parallel to the second line, and the induced radio frequency signal is output from the balanced terminal T2, the signal is transmitted in the CW direction along the coils L41 and L42 in the fourth line L4. Thus, the signal output from the balanced terminal T2 is opposite in phase to the signal passing through the third line L3.

Hereinafter, the characteristics of the balun according to Preferred Embodiment 1 will be described by using a comparative example.

Figure 7:
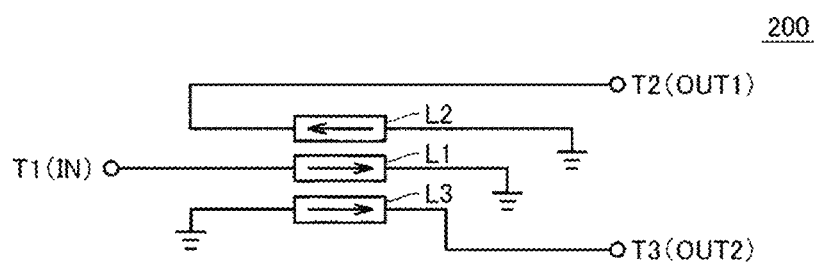
FIG. 7 is a circuit diagram of a balun of Comparative Example 1.

FIG. 7 is a circuit diagram of a balun 200 according to Comparative Example 1. The balun 200 of Comparative Example 1 has a three-wire configuration including three lines without the fourth line L4 in the baluns 100 and 100A according to Preferred Embodiment 1. In the balun having such a configuration, in unbalanced-balanced conversion, generally, a difference in characteristics between balanced signals may occur and there is a possibility that desired balance characteristics cannot be achieved. In particular, when the applied frequency band is wide, the difference in characteristics between balanced signals tends to be large.

Figure 8:
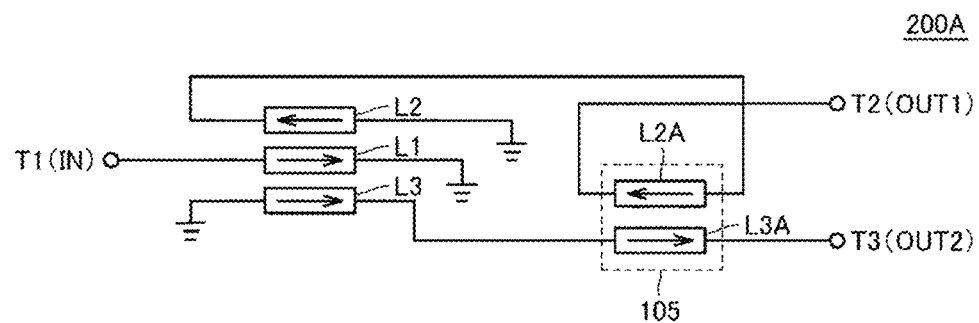
FIG. 8 is a circuit diagram of a balun of Comparative Example 2.

In order to improve the balance characteristics, a configuration in which a common mode choke coil 105 is connected to two balanced terminals of the balun 200 illustrated in FIG. 7 may be used as in a balun 200A illustrated in FIG. 8. The common mode choke coil generally has a configuration in which two lines having the same line length and different winding directions from each other are wound around a common core (not illustrated) made of ferrite or the like. In Comparative Example 2 illustrated in FIG. 8, a line L2A connected between the second line L2 and the balanced terminal T2 and a line L3A connected between the third line L3 and the balanced terminal T3 are provided so as to be electromagnetically coupled. Further, the line L2A and the line L3A are connected such that a phase of a signal passing through the line L2A is opposite to a phase of a signal passing through the line L3A. With this configuration, magnetic fluxes generated in the lines cancel each other out, so that noise in signals output from the balanced terminal T2 and the balanced terminal T3 is removed, and the balance characteristics of the output signals are improved.

However, in the configuration of the balun 200A illustrated in FIG. 8, it is necessary to provide a common mode choke coil in a substrate in addition to the configuration of the three-wire balun, or to separately combine chip components of the common mode choke coil. For this reason, there is a possibility that the size of the entire device is increased and miniaturization is prevented.

On the other hand, in the baluns 100, 100A, and 100B according to Preferred Embodiment 1, by adding the fourth line L4 coupled to the third line L3 in the configuration of the three-wire balun, the third line L3 and the fourth line L4 can achieve a function equivalent to that of a common mode choke coil. Thus, as compared with the balun of Comparative Example 1, it is possible to improve the balance characteristics of signals between the balanced lines while reducing or preventing an increase in size.

Figure 9:
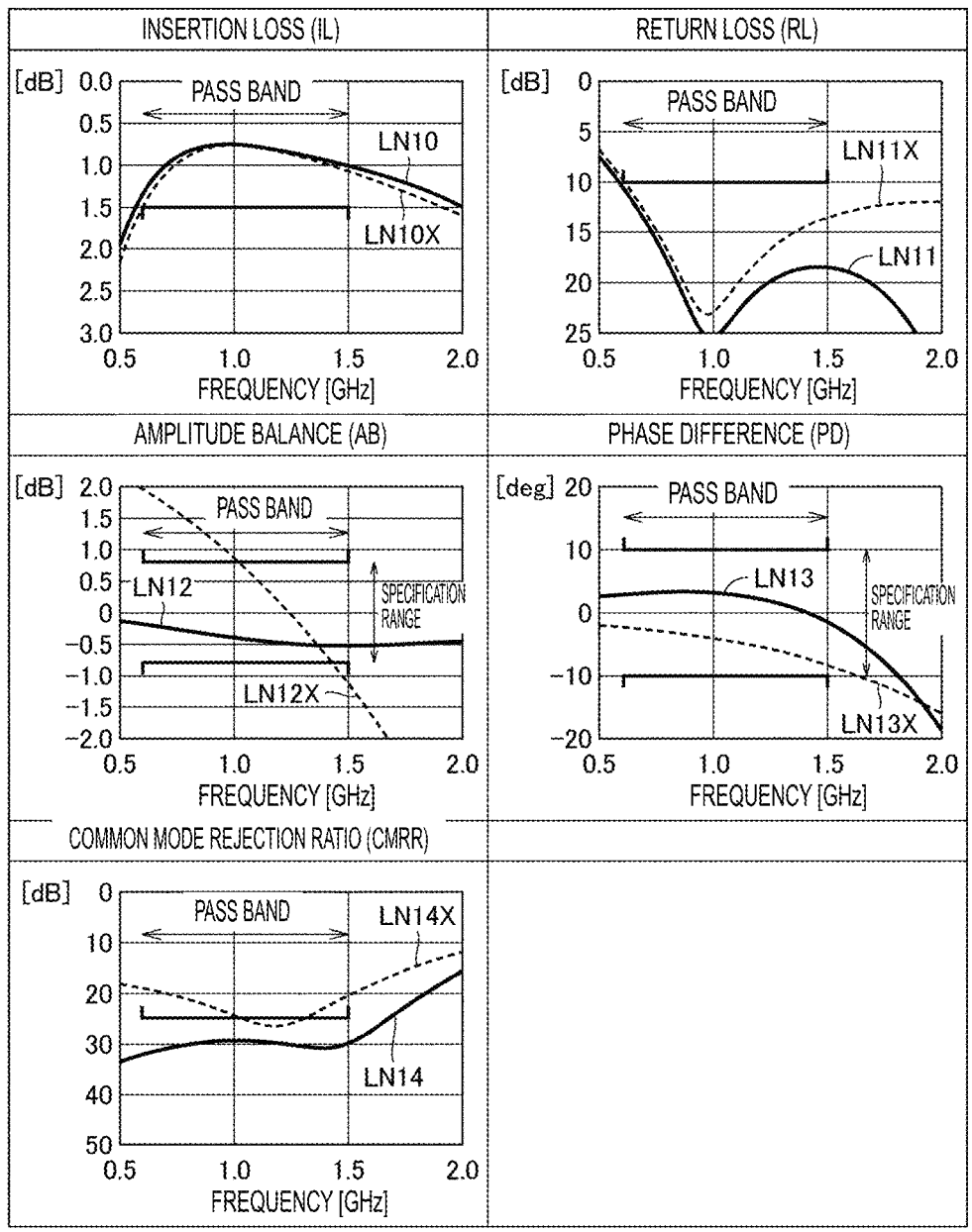
FIG. 9 is a diagram for describing characteristics of the balun according to Preferred Embodiment 1 of the present invention.

FIG. 9 is a diagram for describing characteristics of the balun according to Preferred Embodiment 1. FIG. 9 shows simulation results of the characteristics of an insertion loss (IL), a return loss (RL), an amplitude balance (AB), a phase difference (PD), and a common mode rejection ratio (CMRR) for each of the balun 100 illustrated in FIG. 2 and the balun 200 of Comparative Example 1 illustrated in FIG. 7. In the graphs of the characteristics, solid lines LN10, LN11, LN12, LN13, and LN14 indicate the case of the balun 100 according to Preferred Embodiment 1, and broken lines LN10X, LN11X, LN12X, LN13X, and LN14X indicate the case of the balun 200 according to Comparative Example 1.

In the specifications of this simulation example, a pass band is within a range equal to or larger than about 600 MHz and equal to or less than about 1500 MHz. Additionally, all impedances of external devices connected to the unbalanced terminal T1 and the balanced terminals T2 and T3 are about 50Ω. That is, an impedance ratio between input and output is 1:2 (about 50Ω:about 100Ω).

With reference to FIG. 9, for the insertion loss and the return loss, both the balun 100 of Preferred Embodiment 1 and the balun 200 of Comparative Example 1 satisfy IL: about 1.5 dB or less, and RL: about 10 dB or more over the entire pass band, but the balun 100 (solid lines LN10 and LN11) has slightly lower losses than those of the balun 200 (broken lines LN10X and LN11X). This is because a path loss from the reference potential to the balanced terminal T2 is reduced by the fourth line L4 connected in parallel to the second line L2.

In the case of the balun 200 of Comparative Example 1 (broken line LN12X), the amplitude balance is out of the specification range particularly in the low-frequency region of the pass band. On the other hand, in the case of the balun 100 according to Preferred Embodiment 1 (solid line LN12), it was discovered that the specification range is satisfied over the entire pass band and the balance characteristics are improved.

As for the phase difference, both the balun 100 (solid line LN13) of Preferred Embodiment 1 and the balun 200 (broken line LN13X) of Comparative Example 1 satisfy the specification being within ±10 deg over the entire pass band, but the balun 100 obtains a result closer to 0 dB.

The common mode rejection ratio is an indicator representing characteristics obtained by combining the amplitude balance and the phase difference, and it is generally preferable that the common mode rejection ratio is equal to or higher than about 25 dB, for example. As shown in FIG. 9, the balun 100 (solid line LN14) according to Preferred Embodiment 1 can achieve a common mode rejection ratio higher than that of the balun 200 (broken line LN14X) according to Comparative Example 1 over the entire pass band, and can achieve a common mode rejection ratio equal to or higher than about 25 dB over the entire pass band.

As described above, as in the baluns 100, 100A, and 100B according to Preferred Embodiment 1, by providing a configuration in which the fourth line L4 connected in parallel to the second line L2 connected to the balanced terminal T2 is coupled to the third line L3 connected to the other balanced terminal T3, it is possible to improve the balance characteristics between the balanced terminals over the wide pass band width without significantly increasing the device size of the balun.

Modification

Figure 10:
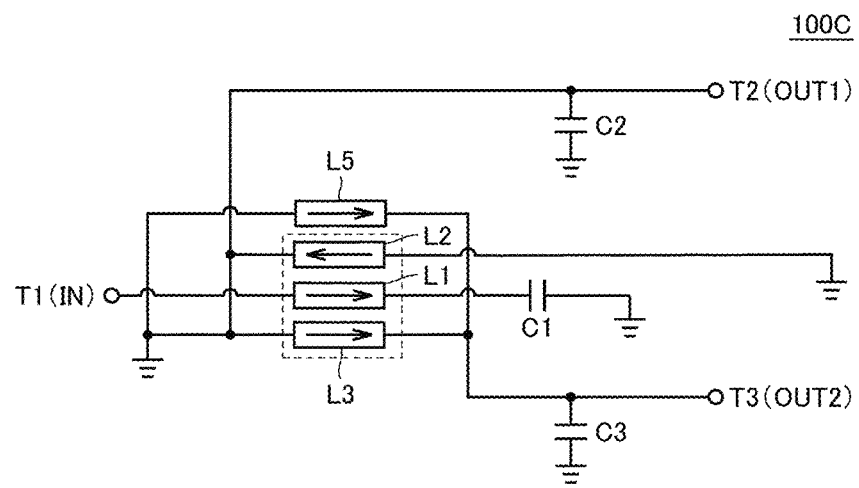
FIG. 10 is a circuit diagram of a balun according to a modification of a preferred embodiment of the present invention.

In the baluns 100, 100A, and 100B according to Preferred Embodiment 1 described above, the configuration is provided in which the fourth line L4 electrically connected in parallel to the second line L2 connected to the balanced terminal T2 is included, but instead of this, as in a balun 100C according to a modification of a preferred embodiment show in FIG. 10, a fifth line L5 electrically connected in parallel to the third line L3 connected to the balanced terminal T3 may be included.

In the balun 100C of FIG. 10, one end of the fifth line L5 is connected to the balanced terminal T3, and the other end is connected to the reference potential. The fifth line L5 is disposed so as to be electromagnetically coupled to the second line L2. The fifth line L5 is configured such that a signal having an opposite phase to that of a signal passing through the second line L2 passes through the fifth line L5.

With such a configuration, the balun 100C achieves an advantageous function equivalent to that of a common mode choke coil by using the second line L2 and the fifth line L5. Thus, also in the balun 100C according to the modification, the balance characteristics between the balanced terminals can be improved over a wide pass band width without significantly increasing the device size of the balun, as in the baluns 100, 100A, and 100B according to Preferred Embodiment 1.

In the above example, the case where all of the impedances of the external devices connected to the unbalanced terminal T1 and the balanced terminals T2 and T3 are about 50Ω, and the impedance ratio between input and output is 1:2 has been described, but the same or substantially the same configuration as described above can be applied to a case where the impedance connected to the balanced terminal is higher. For example, even when all of the impedances of the external devices connected to the unbalanced terminal T1 and the balanced terminals T2 and T3 are about 100Ω and the impedance ratio between input and output is 1:4 (about 50Ω:about 200Ω), the balance characteristics between the balanced terminals can be improved as compared with the configuration of Comparative Example 1 illustrated in FIG. 7.

In a case where the impedance of the balanced line side is set to be higher than the impedance of the unbalanced line side, the number of turns of the coil of the balanced line (the second line L2 and the third line L3) is larger than the number of turns of the coil forming the unbalanced line (the first line L1). Alternatively, the number of turns of the coil of the unbalanced line may be reduced, or the capacitance of the capacitor C1 for shortening the wavelength may be reduced. At this time, a distance between the coil of the balanced line and the coil of the unbalanced line is increased to reduce capacitive coupling between the coils, thus matching a resonant frequency of the balanced line with a resonant frequency of the unbalanced line.

Figure 11:
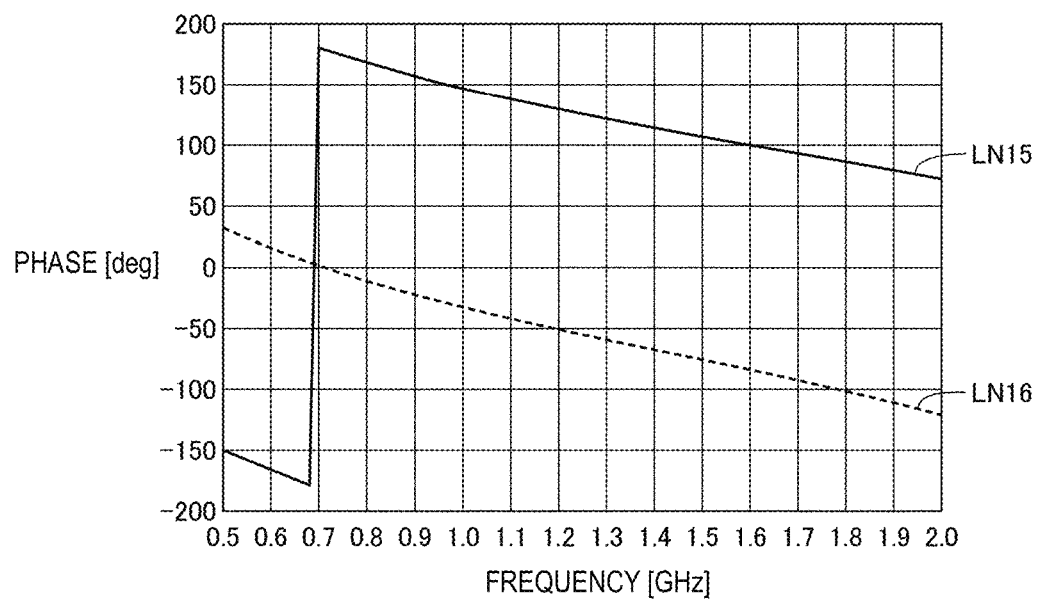
FIG. 11 is a diagram for describing frequency characteristics of a phase of a balanced signal with respect to an unbalanced signal.

In the above description, an example has been described in which a signal output from the balanced terminal T2 has the opposite phase and a signal output from the balanced terminal T3 has the same phase with respect to an input signal input to the unbalanced terminal T1. However, in the balun, a phase of an output signal with respect to an input signal has frequency characteristics, and is not necessarily the same phase or the opposite phase with respect to the input signal. FIG. 11 is a diagram for describing frequency characteristics of a phase of an output signal (balanced signal) with respect to an input signal (unbalanced signal) in the balun according to Preferred Embodiment 1. In FIG. 11, the horizontal axis represents a frequency, and the vertical axis represents a phase. In FIG. 11, a solid line LN15 indicates pass characteristics of a signal output from the balanced terminal T2, and a broken line LN16 indicates pass characteristics of a signal output from the balanced terminal T3.

With reference to FIG. 11, in the example of this simulation, when a frequency is about 0.7 GHz, a signal output from the balanced terminal T2 is opposite in phase to an input signal, and a signal output from the balanced terminal T3 is the same in phase as the input signal. However, as the frequency becomes higher than about 0.7 GHz, a phase of each output signal tends to be gradually delayed with respect to an input signal. Note that, even when the frequency is changed, phases of output signals output from the two balanced terminals are opposite to each other.

Preferred Embodiment 2

In Preferred Embodiment 1 and the modification thereof, the case where the impedance of the device connected to the balanced terminal is equal to or higher than the impedance of the device connected to the unbalanced terminal has been described.

On the other hand, the impedance of the device connected to the balanced terminal may be set lower than the impedance of the device connected to the unbalanced terminal. In this case, in general, a desired impedance ratio is achieved by decreasing the number of turns of the coil of the balanced line in the balun, increasing the number of turns of the coil of the unbalanced line, or increasing the capacitance of the capacitor C1 to adjust a wavelength. However, when the impedance of the balanced line side is set to be low, it is necessary to further increase the degree of capacitive coupling between the unbalanced line and the balanced line in order to match the resonant frequency of the balanced line with the resonant frequency of the unbalanced line.

In order to increase the degree of coupling between the unbalanced line and the balanced line, it is necessary to shorten a distance between the lines, that is, to reduce the thickness of each dielectric layer, but the thickness of the dielectric sheet of the dielectric layer may be limited from the viewpoint of manufacturing restrictions, the mechanical strength of the dielectric layer or the like, for example, so there is a possibility that a desired coupling capacitance cannot be achieved.

Although it is possible to achieve the coupling capacitance that is insufficient due to the limitation of the sheet thickness of the dielectric layer by adding a capacitor for adjustment, there is a possibility that the addition of a capacitor with a desired capacitance in the dielectric substrate increases the size of the entire device and cannot satisfy the demand for miniaturization.

Thus, in Preferred Embodiment 2 of the present invention, in addition to the configuration of the balun of Preferred Embodiment 1, a configuration is provided in which a line connected in parallel to a line connected to the other balanced terminal is provided and coupled to the balun having the above configuration. This can increase the degree of coupling between the unbalanced line and the balanced line, even when the impedance of the balanced terminal side is lower than the impedance of the unbalanced terminal side, the balance characteristics between the balanced terminals can be improved over a wide pass band width without significantly increasing the device size of the balun.

Figure 12:
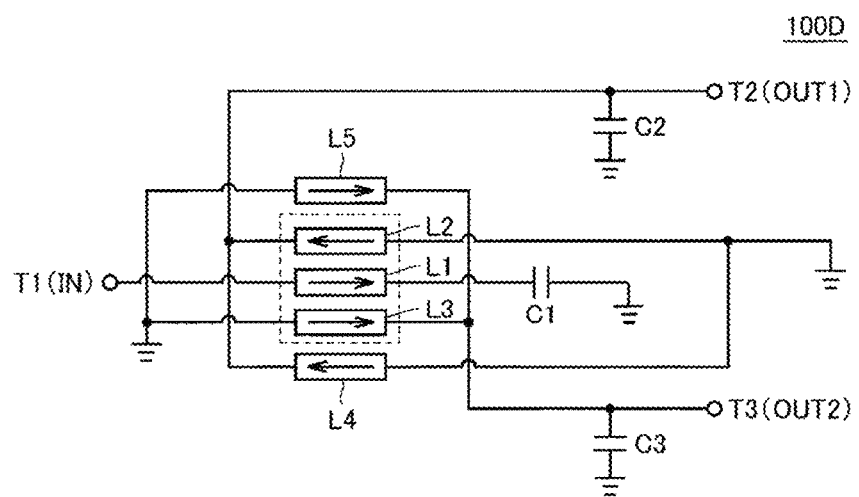
FIG. 12 is a circuit diagram of a balun according to Preferred Embodiment 2 of the present invention.

FIG. 12 is a circuit diagram of a balun 100D according to Preferred Embodiment 2. The configuration of the balun 100D corresponds to a configuration in which the balun 100A of Preferred Embodiment 1 and the balun 100C of the modification are combined. To be specific, the fourth line L4 electrically connected in parallel to the second line L2 connected to the balanced terminal T2 is electromagnetically coupled to the third line L3, and the fifth line L5 electrically connected in parallel to the third line L3 connected to the balanced terminal T3 is electromagnetically coupled to the second line L2. Other configurations are the same as or similar to those of the balun 100A and the balun 100C. With such a configuration, the degree of coupling between the unbalanced line and the balanced line can be increased. Further, in each of the combination of the second line L2 and the fifth line L5 and the combination of the third line L3 and the fourth line L4, an advantageous function substantially similar to that of the common mode choke coil is provided, and thus, the balance characteristics between the balanced lines can be improved.

Figure 13:
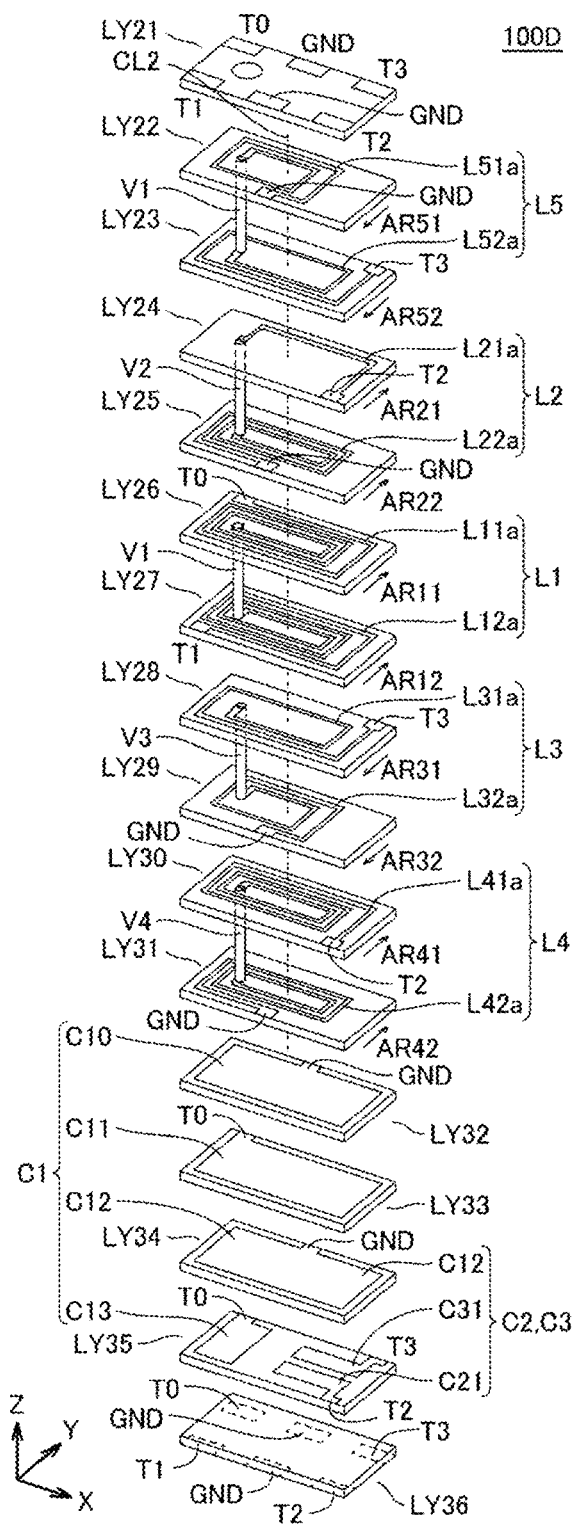
FIG. 13 is an exploded perspective view of the balun of FIG. 12.

FIG. 13 is an exploded perspective view of a balun 100D. With reference to FIG. 13, a dielectric substrate 110 of the balun 100D includes a plurality of dielectric layers LY21 to LY36 that are laminated.

In the dielectric substrate 110, the lines L1 to L5 are adjacently laminated in the order of the fifth line L5, the second line L2, the first line L1, the third line L3, and the fourth line L4 from the upper surface in the lamination direction. According to this lamination order, the first line L1 is coupled to the second line L2 and the third line L3, the second line L2 is further coupled to the fifth line L5, and the third line L3 is further coupled to the fourth line L4. In the example of FIG. 13, the lines L1 to L5 are wound around a common winding axis CL2, and the openings of the coils formed by the lines L1 to L5 are overlapped across the lines L1 to L5.

Each of the lines L1 to L5 is provided across two adjacent layers, and the coils provided in the respective layers are connected by vias. More specifically, the first line L1 has a configuration in which a coil L11a in the sixth layer LY26 and a coil L12a in the seventh layer LY27 are connected by the via V1. The second line L2 has a configuration in which a coil L21a in the fourth layer LY24 and a coil L22a in the fifth layer LY25 are connected by the via V2. The third line L3 has a configuration in which a coil L31a in the eighth layer LY28 and a coil L32a in the ninth layer LY29 are connected by the via V3. The fourth line L4 has a configuration in which a coil L41a in the tenth layer LY30 and a coil L42a in the eleventh layer LY31 are connected by the via V4. The fifth line L5 has a configuration in which a coil L51a in the second layer LY22 and a coil L52a in the third layer LY23 are connected by the via V5.

The flat plate electrodes C10 and C12 connected to the ground electrode GND are provided in the twelfth layer LY32 and the fourteenth layer LY34, respectively. In addition, the flat plate electrodes C11 and C13 connected to the first line L1 by the terminal T0 are provided in the thirteenth layer LY33 and the fifteenth layer LY35, respectively. The flat plate electrodes C10 to C13 define the adjustment capacitor C1.

Additionally, in the fifteenth layer LY35, a flat plate electrode C21 and a flat plate electrode C31 are further provided. The adjustment capacitor C2 is defined by the flat plate electrode C21 and the flat plate electrode C12 of the fourteenth layer, and the adjustment capacitor C3 is defined by the flat plate electrode C12 and the flat plate electrode C31.

The coils L11a and L12a of the first line L1 are wound in the CCW direction (arrows AR11 and AR12) from a connection point of the coil L12a with the unbalanced terminal T1 toward a connection point of the coil L11a with the terminal T0. The terminal T0 of the coil L11a is connected to the flat plate electrode C11 of the thirteenth layer LY33 and the flat plate electrode C13 of the fifteenth layer LY35 with an outer electrode interposed therebetween, and is connected to the ground electrode GND with the capacitor C1 formed by the twelfth layer LY32 to the fifteenth layer LY35 interposed therebetween. Since a signal input to the unbalanced terminal T1 is transmitted from the unbalanced terminal T1 toward the ground electrode GND, the signal is transmitted in the CCW direction along the coils L11a and L12a.

The coils L21a and L22a of the second line L2 are wound in the CCW direction (arrows AR21 and AR22) from a connection point of the coil L21a with the balanced terminal T2 toward a connection point of the coil L22a with the ground electrode GND. That is, the winding direction of the second line L2 from the balanced terminal T2 toward the reference potential is the same as the winding direction of the first line L1 from the unbalanced terminal T1 toward the reference potential. On the other hand, since a radio frequency signal induced by coupling with the first line L1 is output from the balanced terminal L2 of the second line T2, in the second line L2, the signal is transmitted in the CW direction along the coils L21a and L22a.

The coils L31a and L32a of the third line L3 are wound in the CW direction (arrows AR31 and AR32) from a connection point of the coil L31a with the balanced terminal T3 toward a connection point of the coil L32a with the ground electrode GND. That is, the winding direction of the third line L3 from the balanced terminal T3 toward the reference potential is opposite to the winding direction of the first line L1 from the unbalanced terminal T1 toward the reference potential. On the other hand, since a radio frequency signal induced by coupling with the first line L1 is output from the balanced terminal T3 of the third line L3, the signal output from the balanced terminal T3 is transmitted in the CCW direction along the coils L31a and L32a in the third line L3.

The coils L41a and L42a of the fourth line L4 are wound in the CCW direction (arrows AR41 and AR42) from a connection point of the coil L42a with the balanced terminal T2 toward a connection point of the coil L41a with the ground electrode GND. That is, the winding direction of the fourth line L4 is opposite to the winding direction of the third line L3. On the other hand, since the fourth line L4 is connected in parallel to the second line and the induced radio frequency signal is output from the balanced terminal T2, the signal is transmitted in the CW direction along the coils L41a and L42a in the fourth line L4. Thus, the signal output from the balanced terminal T2 is opposite in phase to the signal passing through the third line L3.

The coils L51a and L52a of the fifth line L5 are wound in the CW direction (arrows AR51 and AR52) from a connection point of the coil L52a with the balanced terminal T3 toward a connection point of the coil L51a with the ground electrode GND. That is, the winding direction of the fifth line L5 is opposite to the winding direction of the second line L2. On the other hand, since the fifth line L5 is connected in parallel with the third line and the induced radio frequency signal is output from the balanced terminal T3, the signal is transmitted in the CCW direction along the coils L51a and L52a in the fifth line L5. Thus, the signal output from the balanced terminal T3 is opposite in phase to the signal passing through the second line L2.

Figure 14:
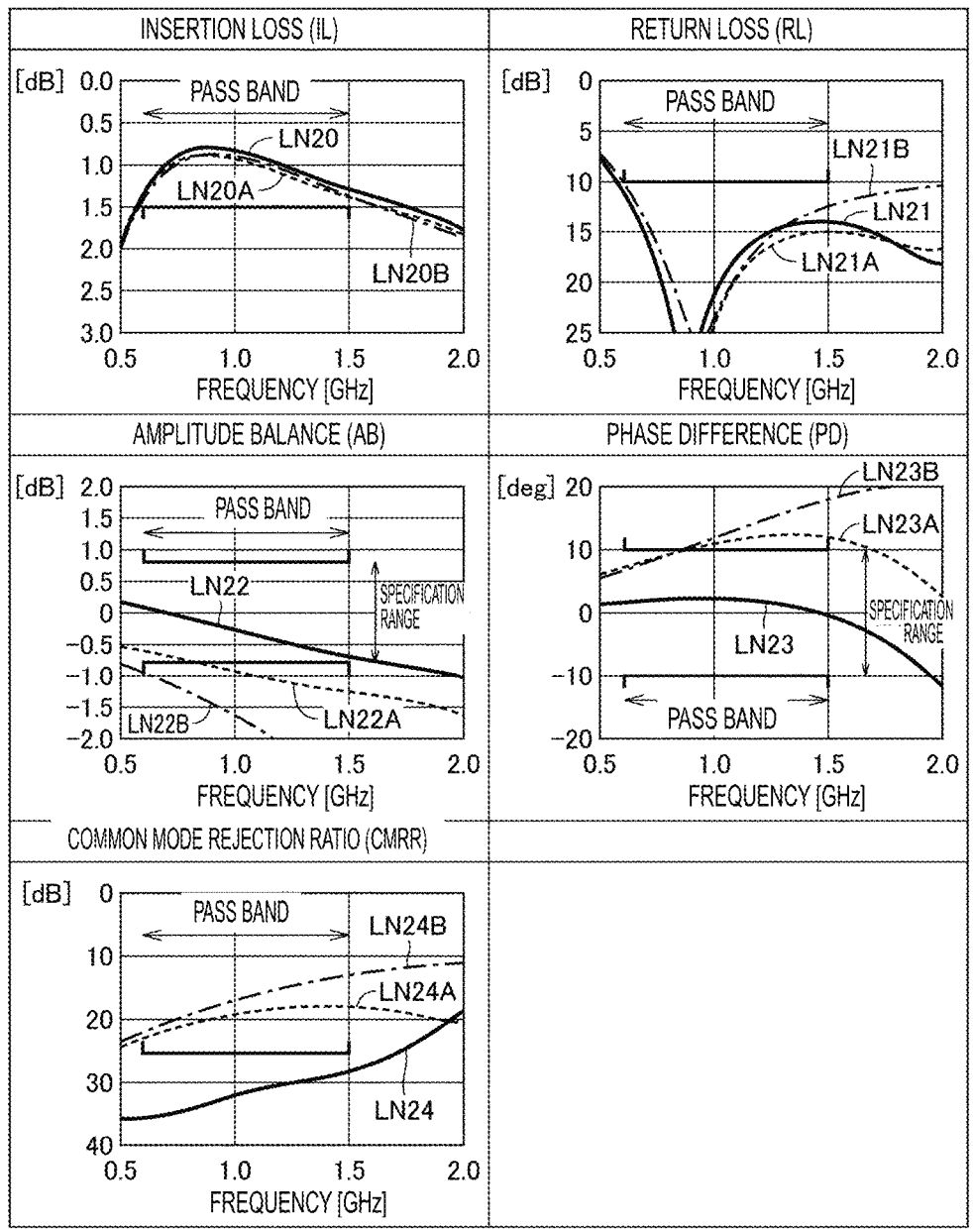
FIG. 14 is a diagram for describing characteristics of the balun according to Preferred Embodiment 2 of the present invention.

FIG. 14 is a diagram for describing characteristics of the balun 100D according to Preferred Embodiment 2. FIG. 14 shows simulation results of the characteristics of an insertion loss (IL), a return loss (RL), an amplitude balance (AB), a phase difference (PD), and a common mode rejection ratio (CMRR) for each of the parallel-five-wire balun 100D of Preferred Embodiment 2, the parallel-four-wire balun 100 of Preferred Embodiment 1, and the parallel-three-wire balun 200 of Comparative Example 1. In the graphs of the characteristics, solid lines LN20, LN21, LN22, LN23, and LN24 indicate the case of the balun 100D of Preferred Embodiment 2, broken lines LN20A, LN21A, LN22A, LN23A, and LN24A indicate the case of the balun 100 of Preferred Embodiment 1, and dashed-dotted lines LN20B, LN21B, LN22B, LN23B, and LN24B indicate the case of the balun 100 of Comparative Example 1.

Note that in the specifications in this simulation example, the pass band is within the range being equal to or larger than about 600 MHz and equal to or less than about 1500 MHz, as in Preferred Embodiment 1. In the balun 100D, an impedance of an external device connected to the unbalanced terminal T1 is about 50Ω, and an impedance of an external device connected to each of the balanced terminals T2 and T3 is about 25Ω. That is, an impedance ratio between input and output is 1:1 (about 50Ω:about 50Ω), and the impedance of the balanced terminal side is lower than the impedance of the unbalanced terminal side.

With reference to FIG. 14, for the insertion loss and the return loss, all of the balun 100D of Preferred Embodiment 2, the balun 100 of Preferred Embodiment 1, and the balun 200 of Comparative Example 1 satisfy IL: about 1.5 dB or less and RL: about 10 dB or more over the entire pass band. However, for the amplitude balance and the phase difference, the balun 100 (broken lines LN22A and LN23A) according to Preferred Embodiment 1 and the balun 200 (dashed-dotted lines LN22B and LN23B) according to Comparative Example 1 have a region outside of the specification range. On the other hand, in the balun 100D (solid lines LN22 and LN23) of Embodiment 2, both of the amplitude balance and the phase difference are within the specification range. Thus, although the balun 100 (broken line LN24A) of Preferred Embodiment 1 and the balun 200 (dashed-dotted line LN24B) of Comparative Example 1 have a frequency band whose common mode rejection ratio is lower than about 25 dB, the balun 100D (solid line LN24) of Preferred Embodiment 2 can achieve a common mode rejection ratio being equal to or higher than about 25 dB over the entire pass band.

That is, it can be seen that in the case where the impedance of the balanced line side is lower than that of the unbalanced line side, even when the desired balance characteristics cannot be achieved by the balun with the configuration described in Preferred Embodiment 1, the desired balance characteristics can be achieved with the configuration of Preferred Embodiment 2.

Preferred Embodiment 3

In the examples of the baluns described in Preferred Embodiment 1 and Preferred Embodiment 2, as illustrated in FIG. 6 and FIG. 13, a configuration in which each line includes the coil extending across two layers has been described. When the balun is used in a low-frequency region, it may be necessary to further increase the line length of the coil. In this case, depending on the frequency to be used, a desired line length cannot be achieved with two layers, and it may be necessary to form a coil across more layers.

Here, when an outer electrode to be used for connection to an external device is provided at a side surface of a dielectric substrate (see FIG. 4) as in an example of a balun according to a preferred embodiment of the present invention, it is preferable that an end portion of each line connected to the outer electrode is positioned at an outer peripheral portion of each dielectric layer. However, when a spiral coil includes an odd number (for example, three) dielectric layers, one of end portions of the coil may be positioned at an inner side inward from the outer peripheral portion of the dielectric layer in the uppermost layer or the lowermost layer of the dielectric layers of the line. In this case, a layer for providing a wiring pattern to lead out the end portion of the coil positioned at the inner side is separately required, which may increase the size of the entire balun.

In addition, in a case where an even number being equal to or larger than four dielectric layers is provided, a portion where a distance with respect to an adjacent line is long is generated, and thus, coupling with the adjacent line is weakened, and there is a possibility that sufficient characteristics cannot be obtained.

Thus, in Preferred Embodiment 3 of the present invention, a configuration in which both ends of a coil to be provided are disposed at an outer peripheral portion of a dielectric layer while three dielectric layers are used will be described.

Figure 15:
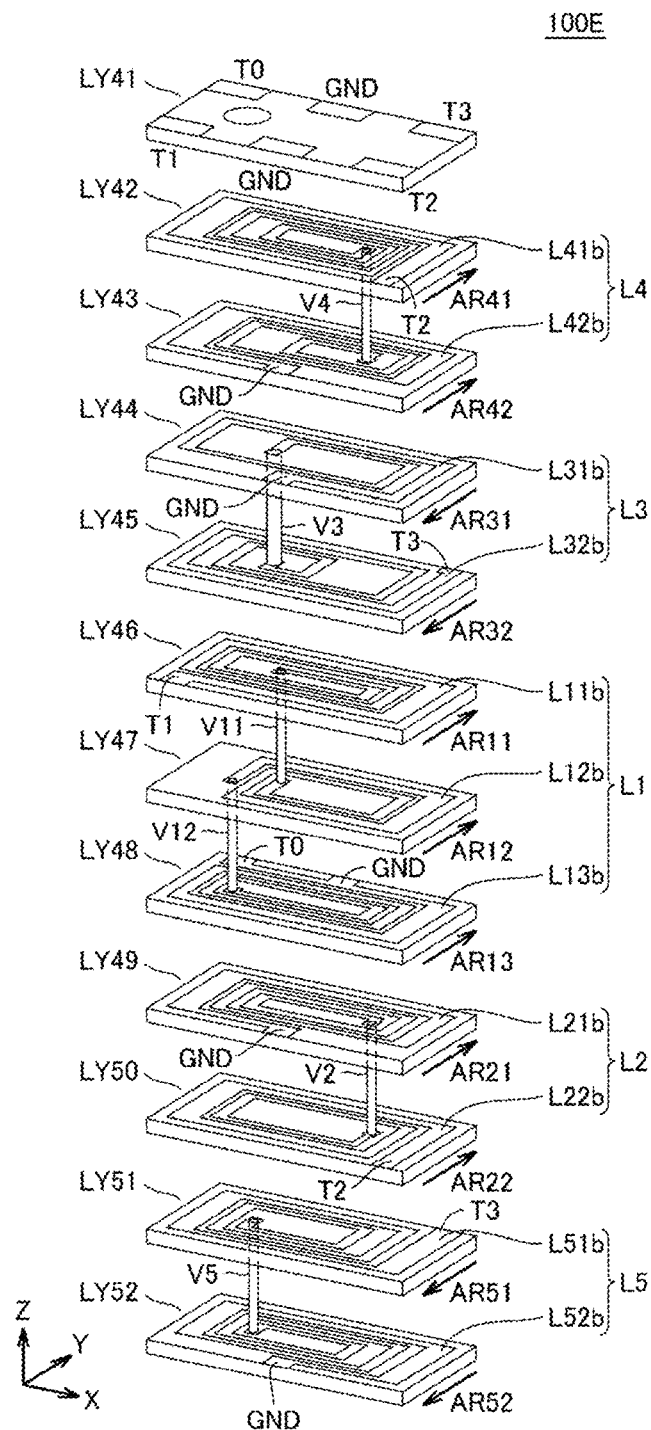
FIG. 15 is an exploded perspective view of a balun according to Preferred Embodiment 3 of the present invention.

FIG. 15 is an exploded perspective view of a balun 100E according to Preferred Embodiment 3. With reference to FIG. 15, a dielectric substrate 110 of the balun 100E includes a plurality of dielectric layers LY41 to LY52 that are laminated. The balun 100E includes five lines L1 to L5, as in the balun 100D of Preferred Embodiment 2. Note that, in the balun 100E, the lamination order of the lines is reversed from that of the balun 100D. That is, in the balun 100E, the lines L1 to L5 are laminated adjacent to each other in the lamination direction from the lower surface in the order of the fifth line L5, the second line L2, the first line L1, the third line L3, and the fourth line L4. According to this lamination order, the first line L1 is coupled to the second line L2 and the third line L3, the second line L2 is further coupled to the fifth line L5, and the third line L3 is further coupled to the fourth line L4. In addition, in the balun 100E, a layer providing an adjustment capacitor is omitted by adjusting the impedance of each line.

In the example of the balun 100E of FIG. 15, among the lines L1 to L5, the first line L1 is provided across three adjacent layers, and the lines L2 to L5 are provided across two adjacent layers as in the balun 100D. More specifically, the first line L1 has a configuration in which a coil L11$b$ in the sixth layer LY46 and a coil L12$b$ in the seventh layer LY47 are connected to each other by a via V11, and the coil L12$b$ in the seventh layer LY47 and a coil L13$b$ in the eighth layer LY48 are further connected to each other by a via V12. The second line L2 has a configuration in which a coil L21$b$ in the ninth layer LY49 and a coil L22$b$ in the tenth layer LY50 are connected by a via V2. The third line L3 has a configuration in which a coil L31$b$ in the fourth layer LY44 and a coil L32$b$ in the fifth layer LY45 are connected by a via V3. The fourth line L4 has a configuration in which a coil L41$b$ in the second layer LY42 and a coil L42$b$ in the third layer LY43 are connected by a via V4. The fifth line L5 has a configuration in which a coil L51$b$ in the eleventh layer LY51 and a coil L52$b$ in the twelfth layer LY52 are connected by a via V5.

For the lines L2 to L5 each of which includes two adjacent layers, the end portions connected to the balanced terminals T2 and T3 are disposed at the outer peripheral portion of one of the layers, and the end portion connected to the ground electrode GND is disposed at the outer peripheral portion of the other layer. The via connecting the two layers is provided at an inner side inward from the outer peripheral portion of each dielectric layer.

Both ends of the coil L12$b$ in the second layer of the first line L1 are individually connected to the coil L11$b$ in the first layer and the coil L13$b$ in the third layer, and are not connected to the unbalanced terminal T1 or the ground electrode GND. For this reason, in the coil L11$b$ and the coil L13$b$, the end portion connected to the coil L12$b$ is disposed at an inner side inward from the outer peripheral portion of the dielectric layer. Thus, the coil L12$b$ in the second layer is wound such that both ends are disposed at an inner side inward from the outer peripheral portion of the dielectric layer in which the coil L12$b$ is provided. In other words, both ends of the coil L12$b$ in the second layer are provided at an inner side inward from a line conductor of the outermost periphery of the coil L11b in the first layer, and are further provided at an inner side inward from a line conductor of the outermost periphery of the coil L13b in the third layer.

By configuring the coils in the above-described shapes, even when the coil includes three dielectric layers, the end portions of the coil can be disposed at the outer peripheral portions of the dielectric layers in the first layer and the third layer of the first line L1. Thus, since the line length can be increased without weakening the coupling between the lines, it is possible to reduce or prevent an increase in the size of the entire balun even in a balun intended for a relatively low frequency band.

Note that, in the example of FIG. 15, a case where the first line connected to the unbalanced terminal includes three dielectric layers has been described, but another line may include three dielectric layers instead of or in addition to the first line.

In Preferred Embodiment 3, the "sixth layer LY46" of the first line corresponds to the "first dielectric layer". The "seventh layer LY47" of the first line corresponds to the "second dielectric layer". The "eighth layer LY48" of the first line corresponds to the "third dielectric layer".

Preferred Embodiment 4

In general, in a balun, it is preferable that outputs of two balanced terminals have the same phase in a target pass band. That is, it is preferable that a phase difference between signals output from the two unbalanced terminals is close to 0°. However, in the multi-wire balun as described above, a coupling state is not necessarily symmetrical due to the shape of the coil in each line, and the like, and frequency characteristics may be generated in the phase difference. In particular, for the first line connected to the unbalanced terminal, when the coupling with the adjacent second line and third line is asymmetric, a phase difference is likely to occur between outputs of the two balanced terminals.

Thus, in Preferred Embodiment 4 of the present invention, description will be provided of a configuration of a multi-wire balun in which coils defining lines to be connected to unbalanced terminals are provided symmetrically in a lamination direction to improve the symmetry of a coupling state between the lines and to improve frequency characteristics in phase difference.

Figure 16:
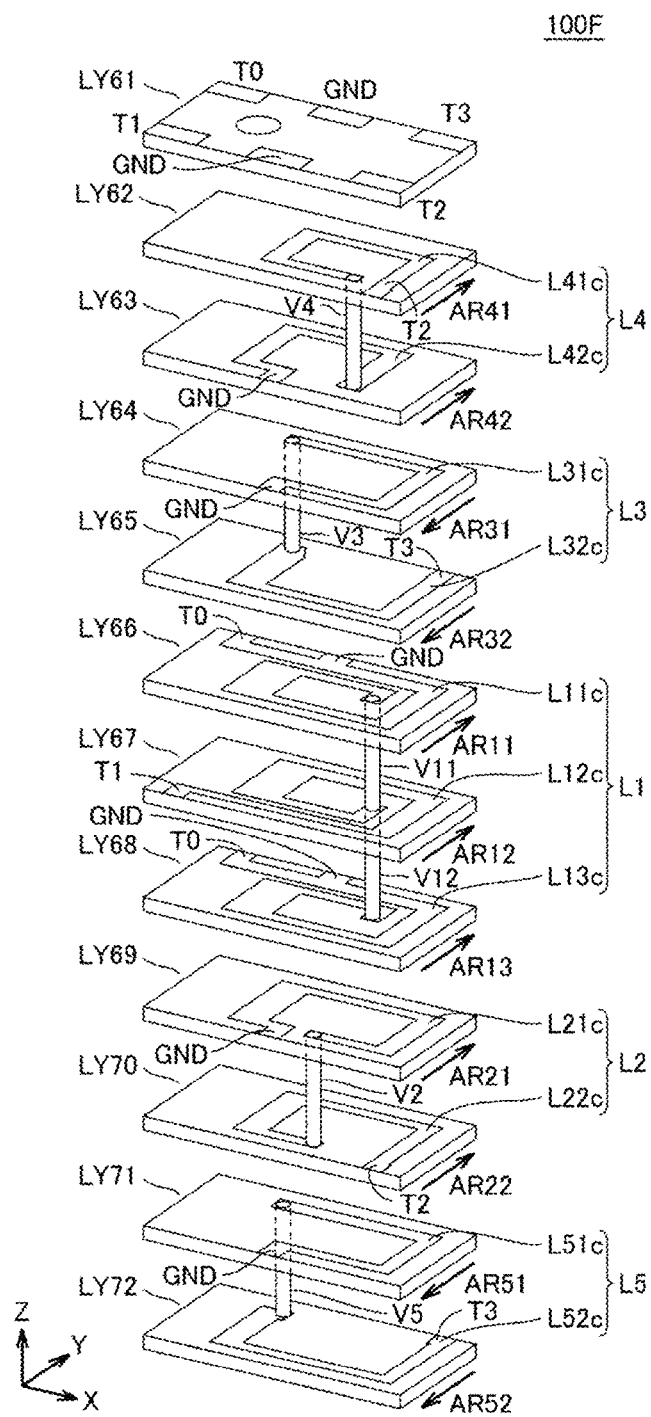
FIG. 16 is an exploded perspective view of a balun according to Preferred Embodiment 4 of the present invention.

FIG. 16 is an exploded perspective view of a balun 100F according to Preferred Embodiment 4. With reference to FIG. 16, the dielectric substrate 110 of the balun 100F includes a plurality of dielectric layers LY61 to LY72 that are laminated. The balun 100F includes five lines L1 to L5, as in the balun 100E of Preferred Embodiment 3. The lamination order of the lines in the balun 100F is the same as or similar to that of the balun 100E, and the lines L1 to L5 are adjacently laminated in the lamination direction from the lower surface in the order of the fifth line L5, the second line L2, the first line L1, the third line L3, and the fourth line L4. Also in the balun 100F, a layer defining an adjustment capacitor is omitted by adjusting the impedance of each line.

In the example of the balun 100F of FIG. 16, among the lines L1 to L5, the first line L1 is provided across three adjacent layers, and the lines L2 to L5 are provided across two adjacent layers. More specifically, the first line L1 has a configuration in which a coil L11c in the sixth layer LY66 and a coil L12c in the seventh layer LY67 are connected to each other by the via V11, and the coil L12c in the seventh layer LY67 and a coil L13c in the eighth layer LY68 are further connected to each other by the via V12. The second line L2 has a configuration in which a coil L21c in the ninth layer LY69 and a coil L22c in the tenth layer LY70 are connected by the via V2. The third line L3 has a configuration in which a coil L31c in the fourth layer LY64 and a coil L32c in the fifth layer LY65 are connected by the via V3. The fourth line L4 has a configuration in which a coil L41c in the second layer LY62 and a coil L42c in the third layer LY63 are connected by the via V4. The fifth line L5 has a configuration in which a coil L51c in the eleventh layer LY71 and a coil L52c in the twelfth layer LY72 are connected by the via V5.

Figure 17A:
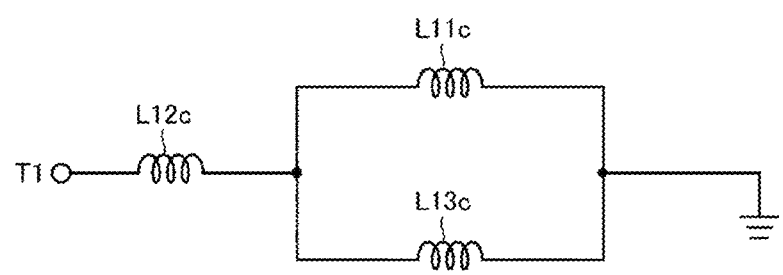
FIGS. 17A and 17B are diagrams illustrating an equivalent circuit of a first line according to Preferred Embodiment 4 of the present invention.

One end of the coil L12c in the second layer of the first line L1 is connected to the unbalanced terminal T1 in an outer peripheral portion of the dielectric layer. The other end of the coil L12c is connected to one end of the coil L11c in the first layer through the via V11 at an inner side than the outer peripheral portion of the dielectric layer. Additionally, the other end of the coil L12c is connected to one end of the coil L13c in the third layer through the via V12. Then, the other end of the coil L11c and the other end of the coil L13c are connected to the ground electrode GND in the outer peripheral portions of the respective dielectric layers. That is, as illustrated in the equivalent circuit in FIG. 17A, the coil L11c in the first layer and the coil L13c in the third layer are connected in parallel between the coil L12c in the second layer and the ground electrode GND.

Further, in the balun 100F, the coil L11c in the first layer and the coil L13c in the third layer of the first line L1 have the same or substantially the same line length and the same or substantially the same shape. In other words, in plan view of the balun 100F in the lamination direction, the coil L11c and the coil L13c entirely or substantially entirely overlap each other. When the first line connected to the unbalanced terminal T1 has such a symmetrical configuration, signals having the same phase propagate through the coil L13c coupled to the second line L2 and the coil L11c coupled to the third line L3. As a result, it is possible to reduce the influence of the first line L1 on the phase difference of signals caused by electromagnetic coupling with the first line L1 between other lines connected to the balanced terminals T2 and T3. Thus, it is possible to improve the frequency characteristics in the phase difference.

Note that, in the example of the balun 100F, a case where the coil L11c and the coil L13c of the first line L1 have the same or substantially the same shape has been described, but the shapes of these coils are not necessarily the same or substantially the same. For example, in a case where the shapes of the coils of the second line L2 and the third line L3 that are coupled to the coils are different from each other, the shapes of the coil L11c and the coil L13c may be individually changed corresponding thereto to reduce the phase difference between the signals generated in the second line L2 and the third line L3.

Figure 17B:
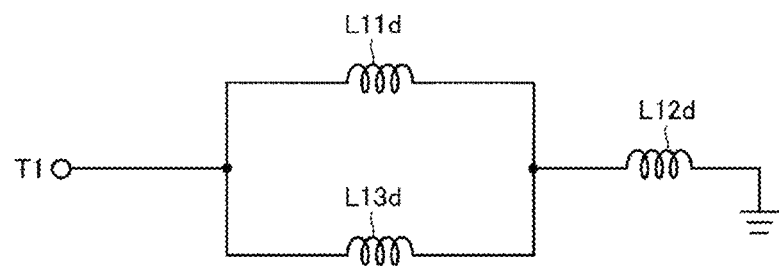

Additionally, as in the equivalent circuit of FIG. 17B, one end of the coil 12d in the second layer may be connected to the ground electrode GND, and the coil 11d in the first layer and the coil 13d in the third layer may be connected in parallel between the other end of the coil 12d and the unbalanced terminal T1.

Figure 18:
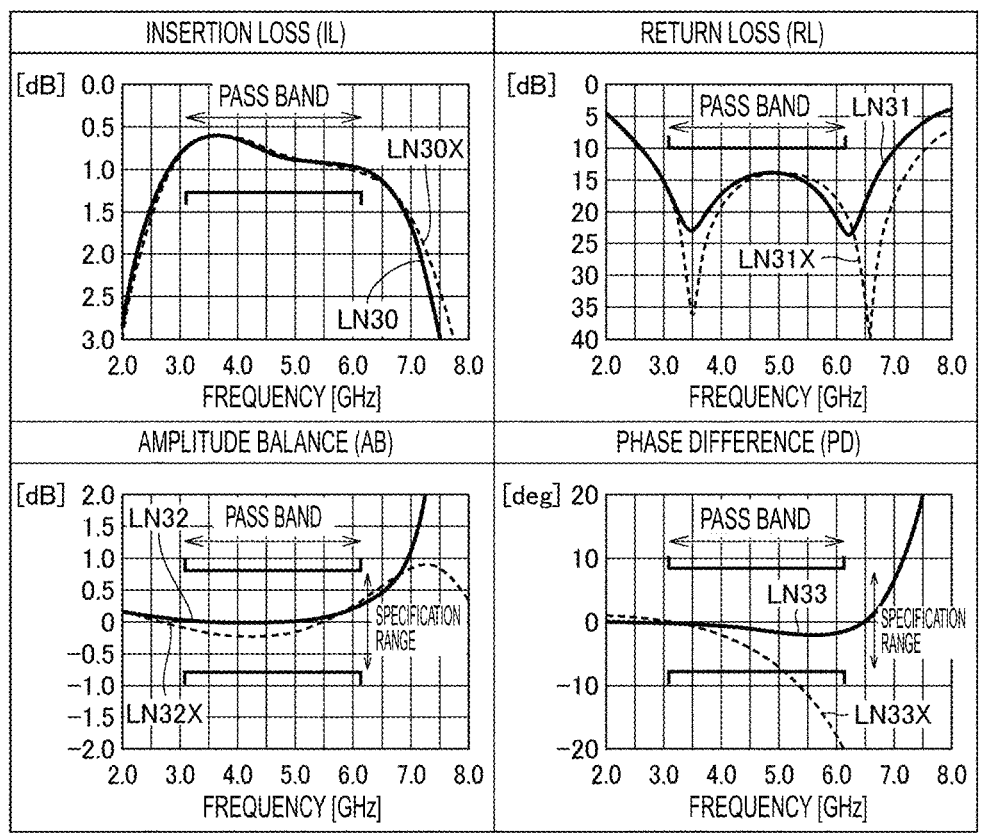
FIG. 18 is a diagram for describing characteristics of the balun according to Preferred Embodiment 4 of the present invention.

FIG. 18 is a diagram for describing characteristics of the balun according to Preferred Embodiment 4. FIG. 18 shows an insertion loss (IL), a return loss (RL), an amplitude balance (AB), and a phase difference (PD) in each of a case where the first line L1 has a symmetrical shape in the lamination direction (Preferred Embodiment 4) and a case where the first line L1 has an asymmetrical shape (comparative example). In the graphs of the respective characteristics, solid lines LN30, LN31, LN32, and LN33 indicate the case of the balun 100F of Preferred Embodiment 4, and broken lines LN30X, LN31X, LN32X, and LN33X indicate the case of the comparative example.

In the specification range (for example, from about 600 MHz to about 1500 MHz) of the pass band in the example of this simulation, in the case of the comparative example, desired specifications are satisfied for the insertion loss, the return loss, and the amplitude balance, but for the phase difference, the difference increases as the frequency increases, so the specification range is not satisfied in a range exceeding about 5 GHz. On the other hand, in the case of the balun 100F according to Preferred Embodiment 4, the insertion loss, the return loss, and the amplitude balance are within the desired specification range as in the case of the comparative example, and further, the phase difference is approximately 0° over the range of the pass band. That is, in the balun 100F according to Preferred Embodiment 4, the frequency characteristics of the phase difference are improved.

As described above, by configuring the first line L1 in a symmetrical shape in the lamination direction, the symmetry of the coupling state between adjacent lines can be improved, and the frequency characteristics of the phase difference of the balun as a whole can be improved.

Note that the "coil 11c" or "coil 11d" in Preferred Embodiment 4 corresponds to the "first coil". The "coil 12c" or "coil 12d" in Preferred Embodiment 4 corresponds to the "second coil". The "coil 13c" or "coil 13d" in Preferred Embodiment 4 corresponds to the "third coil".

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A balun comprising:
   an unbalanced terminal;
   a first balanced terminal and a second balanced terminal;
   a first line connected between the unbalanced terminal and a reference potential;
   a second line connected between the first balanced terminal and the reference potential and coupled to the first line;
   a third line connected between the second balanced terminal and the reference potential and coupled to the first line; and
   a fourth line connected in parallel to the second line and coupled to the third line; wherein
   the fourth line is configured such that a signal with an opposite phase to a phase of a signal passing through the third line passes through the fourth line.

2. The balun according to claim 1, further comprising:
   a fifth line connected in parallel to the third line and coupled to the second line; wherein
   the fifth line is configured such that a signal with an opposite phase to a signal passing through the second line passes through the fifth line.

3. The balun according to claim 1, further comprising a third capacitor connected between the second balanced terminal and the reference potential.

4. The balun according to claim 1, further comprising a first capacitor connected between the first line and the reference potential.

5. The balun according to claim 1, further comprising a second capacitor connected between the first balanced terminal and the reference potential.

6. A balun comprising:
   an unbalanced terminal;
   a first balanced terminal and a second balanced terminal;
   a first line connected between the unbalanced terminal and a reference potential;
   a second line connected between the first balanced terminal and the reference potential and coupled to the first line;
   a third line connected between the second balanced terminal and the reference potential and coupled to the first line; and
   a fifth line connected in parallel to the third line and coupled to the second line; wherein
   the fifth line is configured such that a signal with an opposite phase to a phase of a signal passing through the second line passes through the fifth line.

7. The balun according to claim 6, further comprising a first capacitor connected between the first line and the reference potential.

8. The balun according to claim 6, further comprising a second capacitor connected between the first balanced terminal and the reference potential.

9. The balun according to claim 6, further comprising a third capacitor connected between the second balanced terminal and the reference potential.

10. A balun comprising:
    a dielectric substrate including a plurality of laminated dielectric layers;
    an unbalanced terminal in the dielectric substrate;
    a first balanced terminal and a second balanced terminal in the dielectric substrate;
    a reference potential terminal in the dielectric substrate;
    a first line connected between the unbalanced terminal and the reference potential terminal;
    a second line connected between the first balanced terminal and the reference potential terminal;
    a third line connected between the second balanced terminal and the reference potential terminal; and
    a fifth line connected in parallel to the third line; wherein
    each of the first, second, third, and fifth lines define a coil with a winding axis in a lamination direction of the dielectric substrate;
    in the dielectric substrate, the first, second, third, and fifth lines are laminated in an order of the fifth line, the second line, the first line, and the third line in the lamination direction;
    a winding direction of the second line from the first balanced terminal toward the reference potential terminal is the same as a winding direction of the first line from the unbalanced terminal toward the reference potential terminal;
    a winding direction of the third line from the second balanced terminal toward the reference potential terminal is opposite to a winding direction of the first line from the unbalanced terminal toward the reference potential terminal;
    a winding direction of the fifth line from the second balanced terminal toward the reference potential terminal is opposite to a winding direction of the second line from the first balanced terminal toward the reference potential terminal; and
    openings of the coils defined by the first, second, third, and fifth lines overlap each other in plan view from the lamination direction of the dielectric substrate.

11. The balun according to claim 10, wherein each of the first, second, third, and fifth lines in the dielectric substrate is wound around a common winding axis.

12. The balun according to claim 10, wherein at least one of the first, second, third, and fifth lines in the dielectric substrate is provided across a plurality of dielectric layers.

13. A balun comprising:
a dielectric substrate including a plurality of laminated dielectric layers;
an unbalanced terminal in the dielectric substrate;
a first balanced terminal and a second balanced terminal in the dielectric substrate;
a reference potential terminal in the dielectric substrate;
a first line connected between the unbalanced terminal and the reference potential terminal;
a second line connected between the first balanced terminal and the reference potential terminal;
a third line connected between the second balanced terminal and the reference potential terminal; and
a fourth line connected in parallel to the second line; wherein
each of the first, second, third, and fourth lines define a coil with a winding axis in a lamination direction of the dielectric substrate;
in the dielectric substrate, the first, second, third, and fourth lines are laminated in an order of the second line, the first line, the third line, and the fourth line in the lamination direction;
a winding direction of the second line from the first balanced terminal toward the reference potential terminal is the same as a winding direction of the first line from the unbalanced terminal toward the reference potential terminal;
a winding direction of the third line from the second balanced terminal toward the reference potential terminal is opposite to a winding direction of the first line from the unbalanced terminal toward the reference potential terminal;
a winding direction of the fourth line from the first balanced terminal toward the reference potential terminal is opposite to a winding direction of the third line from the second balanced terminal toward the reference potential terminal; and
openings of the coils defined by the first, second, third, and fourth lines overlap each other in plan view from the lamination direction of the dielectric substrate.

14. The balun according to claim 13, further comprising:
a fifth line connected in parallel to the third line; wherein
in the dielectric substrate, the first, second, third, fourth, and fifth lines are laminated in an order of the fifth line, the second line, the first line, the third line, and the fourth line in the lamination direction; and
a winding direction of the fifth line from the second balanced terminal toward the reference potential terminal is opposite to a winding direction of the second line from the first balanced terminal toward the reference potential terminal.

15. The balun according to claim 13, wherein each of the first, second, third, and fourth lines in the dielectric substrate is wound around a common winding axis.

16. The balun according to claim 13, wherein at least one of the first, second, third, and fourth lines in the dielectric substrate is provided across a plurality of dielectric layers.

17. The balun according to claim 13, wherein at least one of the first, second, third, and fourth lines in the dielectric substrate is provided across a first dielectric layer, a second dielectric layer, and a third dielectric layer;
the second dielectric layer is between the first dielectric layer and the third dielectric layer; and
both ends of the coil in the second dielectric layer are disposed at an inner side inward from a line conductor of an outermost periphery of the coil in the first dielectric layer, and are further disposed at an inner side inward from a line conductor of an outermost periphery of the coil in the third dielectric layer.

18. The balun according to claim 13, wherein
the first line includes a first coil, a second coil, and a third coil in different dielectric layers of the plurality of dielectric layers;
the first coil is in a dielectric layer of the plurality of dielectric layers facing the third line, one end of the first coil is connected to the reference potential terminal, and another end of the first coil is connected to one end of the second coil;
the third coil is in a dielectric layer of the plurality of dielectric layers facing the second line, one end of the third coil is connected to the reference potential terminal, and another end of the third coil is connected to the one end of the second coil; and
the second coil is in a dielectric layer of the plurality of dielectric layers between the first coil and the third coil, and an end of the second coil is connected to the unbalanced terminal.

19. The balun according to claim 18, wherein the first coil and the third coil have a same shape.

20. The balun according to claim 13, wherein
the first line includes a first coil, a second coil, and a third coil in different dielectric layers of the plurality of dielectric layers;
the first coil is in a dielectric layer of the plurality of dielectric layers facing the third line, one end of the first coil is connected to the unbalanced terminal, and another end of the first coil is connected to one end of the second coil;
the third coil is in a dielectric layer of the plurality of dielectric layers facing the second line, one end of the third coil is connected to the unbalanced terminal, and another end of the third coil is connected to the one end of the second coil; and
the second coil is in a dielectric layer of the plurality of dielectric layers between the first coil and the third coil, and another end of the second coil is connected to the reference potential terminal.

* * * * *